(12) United States Patent
Tanaka

(10) Patent No.: US 8,766,276 B2
(45) Date of Patent: Jul. 1, 2014

(54) SEMICONDUCTOR DEVICE AND METHOD OF MANUFACTURING SEMICONDUCTOR DEVICE

(71) Applicant: Renesas Electronics Corporation, Kawasaki (JP)

(72) Inventor: Masayasu Tanaka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/678,784

(22) Filed: Nov. 16, 2012

(65) Prior Publication Data
US 2013/0126893 A1 May 23, 2013

(30) Foreign Application Priority Data

Nov. 22, 2011 (JP) ................................. 2011-255167
Sep. 11, 2012 (JP) ................................. 2012-199932

(51) Int. Cl.
*H01L 29/15* (2006.01)
*H01L 31/0256* (2006.01)

(52) U.S. Cl.
USPC ........................................................ 257/76

(58) Field of Classification Search
USPC ................. 257/76, E21.086, E21.097–E21.1,
257/E21.108–E21.113, E21.117–E21.118,
257/E21.542, E54.3, E21.697–E21.699,
257/192, 194, 185, E29.246–E29.253,
257/E33.004, E31.34, E31.047–E31.051,
257/E29.289–E29.294, 320, 328, 329, 270,
257/271, 341, 331, 301, E21.345, E29.133,
257/E21.418, E29.02, E29.066, E29.257,
257/E21.419, E29.12; 438/46, 47, 77, 84,
438/93–95, 102, 104, 188, 189, 285,
438/603–604, 606, 930–933, 96, 482, 136,
438/137, 156, 173, 192, 206, 212, 170, 202,
438/309–378, 775–777, 791–794
See application file for complete search history.

(56) References Cited

U.S. PATENT DOCUMENTS

| | | | |
|---|---|---|---|
| 6,534,801 B2 | 3/2003 | Yoshida | |
| 7,045,407 B2* | 5/2006 | Keating et al. | 438/198 |
| 7,407,859 B2 | 8/2008 | Kimura et al. | |
| 8,053,340 B2* | 11/2011 | Colombeau et al. | 438/514 |
| 8,093,627 B2 | 1/2012 | Otake et al. | |
| 2004/0245583 A1* | 12/2004 | Horiuchi et al. | 257/408 |
| 2011/0303972 A1* | 12/2011 | Saitoh et al. | 257/329 |

FOREIGN PATENT DOCUMENTS

| | | |
|---|---|---|
| JP | 9-330916 A | 12/1997 |
| JP | 2002-184972 A | 6/2002 |
| JP | 2004-228481 A | 8/2004 |
| JP | 2006-100455 A | 4/2006 |
| JP | 2007-305954 A | 11/2007 |
| JP | 2009-164235 A | 7/2009 |
| JP | 2009-170546 A | 7/2009 |
| JP | 2010-109086 A | 5/2010 |

\* cited by examiner

*Primary Examiner* — Dao H Nguyen
*Assistant Examiner* — Tram H Nguyen
(74) *Attorney, Agent, or Firm* — Sughrue Mion, PLLC

(57) ABSTRACT

A nitride semiconductor layer formed from a nitride semiconductor is provided on at least one surface side of a semiconductor substrate. Impurity regions (a source region, a drain region, and the like) are provided on one surface side in the nitride semiconductor layer and contain an impurity of a first conductivity type. In addition, amorphous regions (a first amorphous region and a second amorphous region) are a part of the impurity regions and are located in a surface layer of the impurity regions. In addition, metallic layers (a source electrode and a drain electrode) come into contact with the amorphous regions (the first amorphous region and the second amorphous region).

20 Claims, 20 Drawing Sheets

SM4

SM4

SM6

SM7

SM7

SEMICONDUCTOR DEVICE AND METHOD OF MANUFACTURING SEMICONDUCTOR DEVICE

This application is based on Japanese patent applications No. 2011-255167 and No. 2012-199932, the content of which is incorporated hereinto by reference.

BACKGROUND

1. Technical Field

The invention relates to a semiconductor device and a method of manufacturing the semiconductor device. The invention is a technology that may be applied to, for example, a semiconductor device having a nitride semiconductor layer and a method of manufacturing the semiconductor device.

2. Related Art

In recent years, semiconductor devices having various structures have been suggested so as to improve characteristics of semiconductor devices formed from a nitride semiconductor.

Japanese Unexamined patent publication NO. 2010-109086 discloses the following semiconductor device. A second semiconductor layer of an undoped nitride semiconductor is provided on a first semiconductor layer of a p-type nitride semiconductor. A third semiconductor layer of an undoped or n-type nitride semiconductor is selectively provided on the second semiconductor layer. An insulating film is provided on the second semiconductor layer. In addition, a control electrode is provided on the insulating film so as to be located between a first main electrode and a second main electrode. A bandgap of the third semiconductor layer is larger than that of the second semiconductor layer. It is described that a normally-off type nitride semiconductor element having a low on-resistance may be provided according to this configuration.

In addition, Japanese Unexamined patent publication NO. 2009-170546 discloses the following semiconductor device. n-AlGaN layers are formed on a p-GaN layer to be located immediately below a source electrode and immediately below a drain electrode. A channel layer is formed in the p-GaN layer and between the n-AlGaN layers. An insulating layer and a gate electrode are formed on the channel layer. It is described that a normally-off type GaN-based semiconductor device, in which contact resistances between the source electrode and drain electrode, and the n-AlGaN layers are lowered, may be provided according to this configuration.

In addition, Japanese Unexamined patent publication NO. 2009-164235 discloses the following nitride semiconductor element. The nitride semiconductor element is a vertical transistor. A nitride semiconductor laminated structure unit is provided on one side of an n-type substrate. In the nitride semiconductor laminated structure unit, an n-type GaN layer, a p-type GaN layer, and an n-type GaN layer are formed on the substrate in this order. A recess is formed at the center of the nitride semiconductor laminated structure unit to expose the lower side n-type GaN layer. A gate insulating layer and a gate electrode are formed at the recess. A drain electrode is provided on the other side of the substrate. A source electrode is provided on the upper side n-type GaN layer. It is described that a resistance value may be effectively decreased according to this configuration.

In addition, Japanese Unexamined patent publication NO. 2002-184972 discloses the following transistor. A GaN buffer layer, an i-type GaN layer having an electric resistance that is equal to or more than $1\times10^6$ $\Omega/cm^2$, and an i-type AlGaN layer are formed on a semi-insulating substrate. An undercut portion formed by digging the i-type GaN layer is formed in a lower portion of the periphery of the i-type AlGaN layer. The n-type GaN layer is provided to bury the undercut portion and a leg portion of the i-type AlGaN layer. A gate electrode is provided on the i-type AlGaN layer. A source electrode and a drain electrode are provided on the n-type GaN layer in such a manner that the gate electrode is interposed between the source and drain electrodes in a plan view. It is described that even when a gate bias voltage is 0 V, a pinch-off state may be realized.

In addition, Japanese Unexamined patent publication NO. 2006-100455 discloses the following nitride semiconductor device. A first nitride semiconductor layer and a second nitride semiconductor layer not containing Al are formed on a substrate in this order. A recess is formed on the second nitride semiconductor layer in such a manner that the first nitride semiconductor layer is exposed. A control electrode (gate electrode) that comes into contact with the first nitride semiconductor layer is provided in the recess. A source electrode and a drain electrode are provided on the second nitride semiconductor layer in such a manner that the control electrode is interposed between the source and drain electrodes in a plan view. Here, the second nitride semiconductor layer is formed by a Metal Organic Chemical Vapor Deposition (MOCVD) at a growth temperature lower than that of the first nitride semiconductor layer. In addition, it is disclosed that the second nitride semiconductor layer is formed with a microcrystalline structure. In addition, paragraph 0061 of Japanese Unexamined patent publication NO. 2006-100455 discloses that the second nitride semiconductor layer is a layer having a high insulation property. It is disclosed that the semiconductor device is made to realize a high withstanding voltage and thus a frequency dispersion of the semiconductor device may be suppressed.

In addition, Japanese Unexamined patent publication NO. 2004-228481 discloses the following compound semiconductor device. An electron transit layer formed from GaN, an electron supply layer formed from n-type AlGaN and a cap layer formed from n-type GaN are disposed on a substrate in this order. Source-side and drain-side recess portions, which are formed by removing at least a part of the thickness of the cap layer, which have a surface roughness more than that of the cap layer under the gate electrode, are provided on both sides of the gate electrode. A source electrode is disposed on the source-side recess portion. A drain electrode is disposed on the drain-side recess portion.

In addition, Japanese Unexamined patent publication NO. 2007-305954 discloses the following field effect transistor. A carrier transit layer is formed in a laminated structure in which a plurality of nitride semiconductor layers are provided, and a gate electrode, a source electrode, and a drain electrode are provided on the laminated structure. The laminated structure has a stepped portion having side surfaces, which expose end portions of the carrier transit layer, on both sides of the gate electrode. A source electrode and a drain electrode to which at least end portions of the carrier transit layer are connected are provided at the side surfaces of the stepped portion.

In addition, Japanese Unexamined patent publication NO. H09-330916 discloses the following method of etching a nitrogen-based compound semiconductor. An etching gas is composed of a mixed gas of a first gas that is at least one of a hydrogen gas and an inert gas, and a second gas that is at least one of a halogen gas and a halogen compound gas. A partial pressure of the second gas is within a range of several Torr to the normal pressure. The nitride-based compound semiconductor is etched using the etching gas at a temperature equal to or higher than 400° C.

SUMMARY

The present inventors have found that a parasitic resistance of a semiconductor device is high even when any technology of the above-described patent documents is applied.

Other problems and new characteristics will be apparent from description of this specification and the attached drawings.

In one embodiment, in a semiconductor substrate including a nitride semiconductor layer, an amorphous region is formed on a surface layer of an impurity region provided on one surface side of the nitride semiconductor layer. In addition, a metallic layer making up the semiconductor device comes into contact with the amorphous region.

According to the embodiment of the invention, it is possible to provide a semiconductor device in which a parasitic resistance is decreased and thus low loss is realized.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
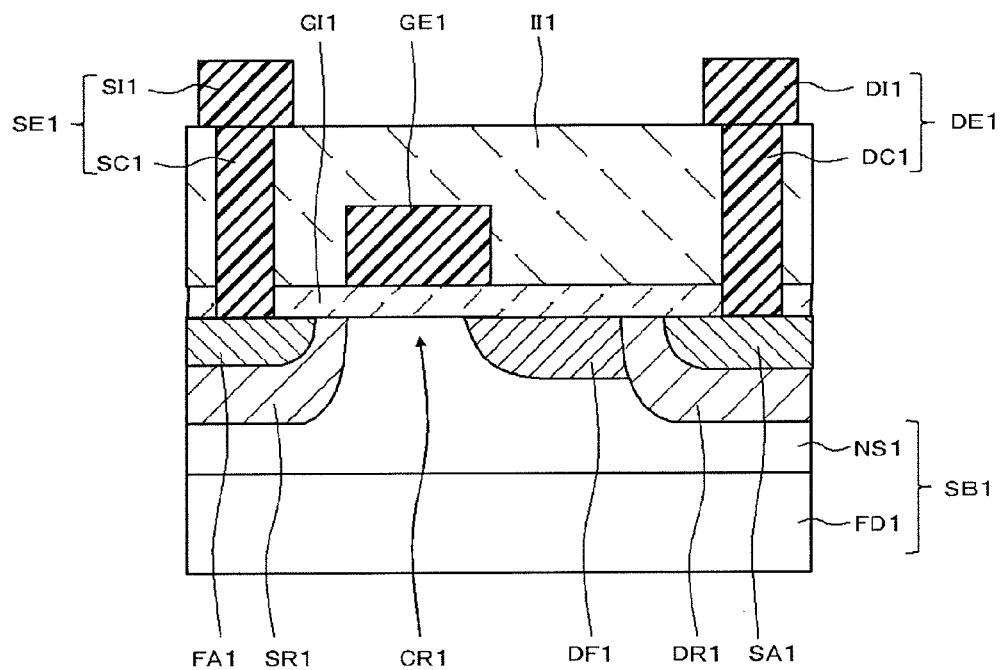
FIG. 1 represents a cross-sectional diagram illustrating a configuration of a semiconductor device related to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the attached drawings. In addition, in all of the drawings, like reference numerals will be given to like parts having substantially the same functions, and redundant description thereof will not be repeated.

First Embodiment

A semiconductor device SM1 related to a first embodiment will be described with reference to FIG. 1. FIG. 1 represents a cross-sectional diagram illustrating a configuration of the semiconductor device SM1 related to the first embodiment. The semiconductor device SM1 has the following configuration. A nitride semiconductor layer NS1 formed from a nitride semiconductor is provided on at least one surface side of a semiconductor substrate SB1. Impurity regions (a source region SR1, a drain region DR1, and the like) are provided on the one surface side in the nitride semiconductor layer NS1, and contain an impurity of a first conductivity type. In addition, amorphous regions (a first amorphous region FA1 and a second amorphous region SA1) are a part of the impurity regions and are located on surface layers of the impurity regions. In addition, metallic layers (a source electrode SE1 and a drain electrode DE1) come into contact with the amorphous regions (the first amorphous region FA1 and the second amorphous region SA1). Hereinafter, details thereof will be described.

Here, "first conductivity type" described later is referred to as, for example, an n-type. In addition, "second conductivity type" is a conductivity type that is opposite to the first conductivity type. Here, the "second conductivity type" is, for example, a p-type.

As represented in FIG. 1, the semiconductor device SM1 is a horizontal type Metal Insulator Semiconductor Field Effect Transistor (MISFET). For example, the semiconductor device SM1 is used as a power supply IC to which a voltage equal to or more than 10 V and less than 1,000 V is applied. Specifically, the semiconductor device SM1 is used for a power supply IC of, for example, a computer, an in-vehicle electronic apparatus, a household electronic apparatus, a communication apparatus, and the like.

In the first embodiment, for example, the nitride semiconductor layer NS1 formed from a Group III nitride semiconductor is provided on at least one surface side of the semiconductor substrate SB1. Specifically, the nitride semiconductor layer NS1 is, for example, a GaN layer. Here, a Group III nitride semiconductor has high withstanding voltage property and saturated drift velocity compared to a Si-based semiconductor device. According to this, the Group III nitride semiconductor may form a switching element in which loss is low with a high withstanding voltage.

The semiconductor substrate SB1 includes, for example, an underlying substrate FD1 and the nitride semiconductor layer NS1 formed from a nitride semiconductor. The nitride semiconductor layer NS1 is provided on the underlying substrate FD1. The underlying substrate FD1 is, for example, a Si substrate, a sapphire substrate, or a SiC substrate. In addition, the entirety of the semiconductor substrate SB1 may be configured by a Group III nitride semiconductor. In this case, the semiconductor substrate SB1 is, for example, a GaN substrate (a bulk GaN substrate). In addition, the semiconductor substrate SB1 may be a substrate configured by only the nitride semiconductor layer NS1 with the underlying substrate FD1 being peeled off. Here, the underlying substrate FD1 is, for example, a Si substrate. According to this, a Si-based semiconductor manufacturing device may be effectively used. In addition, the Si substrate is cheaper than other underlying substrates FD1. Furthermore, since an annealing treatment at a temperature equal to or higher than 1300° C. may not be performed in the Si substrate, application of this embodiment is particularly effective.

A buffer layer (not shown) may be provided between the underlying substrate FD1 and the nitride semiconductor layer NS1. For the buffer layer, a suitable material is used based on a difference in a lattice constant between the underlying substrate FD1 and the nitride semiconductor layer NS1. Specifically, the buffer layer is, for example, an AlGaN layer or a laminated structure thereof.

The nitride semiconductor layer NS1 contains a p-type (second conductivity type) impurity in such a manner that an impurity concentration increases, for example, in a depth direction. In other words, the impurity in the nitride semiconductor layer NS1 is present in a so-called retrograde distribution. In addition, an impurity concentration of the p-type impurity in a surface layer region (a reference numeral thereof is not shown) that is located within a range of approximately 100 nm from the one surface side of the semiconductor substrate SB1 is lower than that of a region located below the surface layer region. In addition, the surface layer region is a non-doped region. Here, the "non-doped" represents that both of a concentration of the n-type impurity and a concentration of the p-type impurity are less than $5 \times 10^{16}$ cm$^{-3}$. According to this, a short channel effect is suppressed, and the semiconductor device SM1 may be miniaturized. Here, the p-type impurity is, for example, Mg. The impurity concentration of the p-type impurity in the surface layer region that is located within a range of approximately 100 nm from one surface side of the semiconductor substrate SB1 is, for example, equal to or less than $5 \times 10^{18}$ cm$^{-3}$. The impurity concentration of the p-type impurity at a region located below the surface layer region is, for example, equal to or more than $1 \times 10^{17}$ cm$^{-3}$ and equal to or less than $5 \times 10^{19}$ cm$^{-3}$.

In the nitride semiconductor layer NS1, the impurity concentration of the second conductivity type on at least surface layer side is preferably equal to or less than $5 \times 10^{-18}$ atoms/cm$^3$. In other words, in the nitride semiconductor layer NS1, the impurity concentration of the second conductivity type of at least a channel region CR1 is preferably equal to or less than $5 \times 10^{-18}$ atoms/cm$^3$. According to this, a resistance is high in the depth direction of the semiconductor substrate SB1, and the channel region CR1 is made to easily generate an electron.

In addition, the nitride semiconductor layer NS1 may be, for example, an intrinsic semiconductor. In other words, in the nitride semiconductor layer NS1, an impurity may not be implanted to a region other than the source region SR1, a drift region DF1, and the drain region DR1 to be described later.

In addition, among plane directions of the nitride semiconductor layer NS1, a plane direction in a normal direction of the semiconductor substrate SB1 is, for example, (0001) (c-plane).

In addition, in the following description, when it is described as "in the semiconductor substrate SB1", this includes "in the nitride semiconductor layer NS1 of the semiconductor substrate SB1" as long as it is not particularly limited.

An impurity region containing the n-type impurity is provided on a main surface side of the nitride semiconductor layer NS1. The "impurity region" described here is formed by ion implantation of an impurity. Here, the source region SR1 that is a first of the impurity region is provided in the nitride semiconductor layer NS1. In addition, the drain region DR1 that is a second of the impurity region is provided in the nitride semiconductor layer NS1, and is provided to be spaced apart from the source region SR1 in a plan view. The channel region CR1 is a region that is interposed between the source region SR1 and the drain region DR1 of the nitride semiconductor layer NS1 in a plan view. As the n-type impurity, elements of Group IV and Group VI are used. Here, the n-type impurity is, for example, Si. The impurity concentration of the n-type impurity in the source region SR1 and the drain region DR1 is, for example, equal to or more than $1 \times 10^{19}$ cm$^{-3}$ and equal to or less than $5 \times 10^{22}$ cm$^{-3}$.

In the first embodiment, the drift region DF1 that is a third of the impurity region is further provided to the nitride semiconductor layer NS1. The drift region DF1 is provided to be spaced from the source region SR1 with the channel region CR1 interposed therebetween in a plan view, and comes into contact with the drain region DR1 on the source region SR1 side. Here, the channel region CR1 is a region that is interposed between the source region SR1 and the drain region DR1 in a plan view. In addition, the drift region DF1 is formed with a concentration lower than that of the source region SR1 and the drain region DR1. The impurity concentration in the drift region DF1 is preferably equal to or less than $\frac{1}{10}$ times that of the source region SR1 and the drain region DR1. Specifically, the impurity concentration is, for example, equal to or more than $1 \times 10^{17}$ cm$^{-3}$ and equal to or less than $5 \times 10^{21}$ cm$^{-3}$. A depth of the drift region DF1 is shallower than that of the source region SR1 and the drain region DR1. When the drift region DF1 is provided in this manner, a withstanding voltage of the semiconductor device SM1 may be maintained and an on-resistance thereof may be lowered. In addition, in the drift region DF1, a length in a direction from the source region SR1 to the drain region DR1 is, for example, equal to or more than 100 nm and less than 10 μm.

A gate insulating layer GI1 is provided on at least the channel region CR1. Here, the gate insulating layer GI1 is provided on the main surface of the semiconductor substrate SB1. In the first embodiment, the gate insulating layer GI1 is, for example, a single layer film or a laminated film of SiN, SiO$_2$, SiON, HfO$_2$, HfSiO$_4$, HfSiON, HfAlO, or the like. Specifically, here, the gate insulating layer GI1 is formed from, for example, SiN. In addition, the thickness of the gate insulating layer GI1 is, for example, equal to or more than 1 nm and equal to or less than 100 nm.

In addition, a gate electrode GE1 comes into contact with the gate insulating layer GI1. In addition, the gate electrode GE1 is provided to overlap at least the channel region CR1 in a plan view. Furthermore, the gate electrode GE1 may be provided to partially overlap the drift region DF1 in a plan view. For example, the gate electrode GE1 is a single layer film or a laminated film of polycrystalline Si, amorphous Si, Ti, TiN, Al, W, silicide materials of various metals, or the like. In the gate electrode GE1, a length (a so-called gate length) in a direction from the source region SR1 to the drain region DR1 is equal to or more than 5 nm and equal to or less than 500 nm. When the gate length is within the above-described range, the on-resistance of the semiconductor device SM1 may be decreased and high withstanding voltage thereof may be realized. Here, the gate electrode GE1 is formed from, for example, titanium silicide.

Here, on surface layers of the above-described impurity regions, amorphous regions are formed as a part of the impurity regions. The amorphous regions are amorphous state. In other words, the amorphous regions are located on the surface layers of the impurity regions. Here, on surface layers of the source region SR1 and the drain region DR1, the first amorphous region FA1 and the second amorphous region SA1 are formed, respectively. In addition, the metallic layers come into contact with the amorphous regions, respectively. Here, the source electrode SE1 and the drain electrode DE1 come into contact with the first amorphous region FA1 and the second amorphous region SA1, respectively. In addition, an amorphous region may not be formed on a surface layer of the drift region DF1.

The depth of each of the amorphous regions may be controlled, for example, by an ion implantation condition during forming of the impurity regions. The ion implantation condition is, for example, ion implantation energy or a dose amount.

The "amorphous regions" described here include a crystal defect formed by the ion implantation of the impurity. As described later, the "amorphous regions" are regions in which a crystal state after an annealing process is not completely recovered by adjusting a temperature of the annealing process that is performed to activate the above-described impurity regions, and a crystal defect that occurs due to the ion implantation remains. In other words, the "amorphous regions" in this embodiment are different from a region that is grown at a low temperature by Chemical Vapor Deposition (CVD). In addition, in a case where the regions are formed by low-temperature CVD, a large amount of impurities such as C (carbon) contained in a film forming raw material gas (for example, trimethylgallium) remains in the regions. On the other hand, a concentration of C (carbon) in the "amorphous regions" in the first embodiment is the same as that of the impurity regions.

In addition, the "amorphous" described here represents a material state in which a long-distance order like a single crystal is not present but a short-distance order is present. Therefore, the "amorphous regions" may contain a microcrystalline region having a grain size equal to or less than 10 nm. In addition, the "amorphous regions" have a distribution in which crystallinity is improved in a direction facing the depth direction from a surface layer side of the impurity regions. In other words, in the "amorphous regions", a range having the above-described short-distance order is enlarged in the depth direction.

In addition, the "amorphous regions" are not scattered in a plan view. The "amorphous regions" are formed in a layer state in the vicinity of the surface layers of the impurity regions.

In addition, the "amorphous regions" may include a region in which the n-type impurity enters the nitride semiconductor in an interstitial atom state. In addition, the "amorphous regions" may include a region in which a mixed crystal is formed by the n-type impurity and an element making up the nitride semiconductor.

In addition, since the impurity regions are formed by ion implantation of the impurity from the main surface side of the semiconductor substrate SB1, the impurity concentration of the "amorphous regions" that are located in the surface layers of the impurity regions is higher than that of the impurity regions.

The amorphous regions and the metallic layers come into ohmic contact with each other, respectively. In other words, a contact resistance between the amorphous regions and the metallic layers is lower than a contact resistance between the impurity regions and the metallic layers. That is, the first amorphous region FA1 and the source electrode SE1 come into ohmic contact with each other. Similarly, the second amorphous region SA1 and the drain electrode DE1 come into ohmic contact with each other. A contact resistance between the amorphous regions and the metallic layers is equal to or less than 0.5 Ωmm. In addition, since the amorphous regions are a part of the impurity regions, an energy barrier between the amorphous regions and the impurity regions is low.

A range of the amorphous regions is, for example, a range in which a density of a crystal defect due to the above-described ion implantation is equal to or more than 10 times with respect to the impurity regions. Due to this, a range of the amorphous regions in a plan view and a range of the amorphous regions in a depth direction are defined. The depth of the amorphous regions is preferably equal to or more than 15 nm and equal to or less than 300 nm. When the depth of the amorphous regions is within the above-described range, the amorphous regions may stably come into ohmic contact with the metallic layers, respectively.

Here, for example, the metallic layers are single layer films or laminated films containing at least one or more materials selected from a Group consisting of Ti, Al, Mo, W, Ru, Au, and V. Here, the metallic layers are preferably formed from, for example, Al. When the above-described material is used as the metallic layers, the contact resistance between the amorphous regions and the metallic layers may be appropriately lowered.

An insulating interlayer II1 is formed on the gate insulating layer GI1 and the gate electrode GE1. The insulating interlayer II1 is formed from, for example, $SiO_2$, SiN, SiON, SiOC, SiOCH, SiCOH, or SiOF. Specifically, the insulating interlayer II1 is formed from, for example, $SiO_2$.

In addition, in regions overlapping the source region SR1 and the drain region DR1 in a plan view, a source contact SC1 and a drain contact DC1 are formed, respectively, to penetrate through the insulating interlayer II1 and the gate insulating layer GI1. The source contact SC1 is provided to come into contact with the source region SR1. The drain contact DC1 is provided to come into contact with the drain region DR1. In addition, a source interconnection SI1 and a drain interconnection DI1 are provided on the insulating interlayer II1. The source interconnection SI1 comes into contact with one end of the source contact SC1. The drain interconnection DI1 comes into contact with one end of the drain contact DC1. The source electrode SE1 is made up by the source contact SC1 and the source interconnection SI1. The drain electrode DE1 is made up by the drain contact DC1 and the drain interconnection DI1.

Although not shown, a multi-layered interconnection layer (not shown) may be formed on the insulating interlayer II1. Furthermore, an electrode pad (not shown) may be formed on the uppermost layer of the multi-layered interconnection layer.

Next, a method of manufacturing the semiconductor device SM1 related to the first embodiment will be described with reference to FIGS. 2A to 5B. FIGS. 2A to 5B represent cross-sectional diagrams illustrating the method of manufacturing the semiconductor device SM1 related to the first embodiment. The method of manufacturing the semiconductor device SM1 related to the first embodiment includes the following processes. First, an impurity of a first conductivity type is implanted in one surface side of the semiconductor substrate SB1 including the nitride semiconductor layer NS1 formed from a nitride semiconductor on at least the one surface side of the semiconductor substrate SB1 to form the amorphous impurity regions (the source region SR1 and the drain region DR1) (an impurity region forming process). Subsequently, the semiconductor substrate SB1 is annealed under a condition in which amorphous regions remain in a part of the impurity regions (an annealing process). According to this process, an impurity in the impurity regions is activated, and the amorphous regions (the first amorphous region FA1 and the second amorphous region SA1) are formed on the surface layers of the impurity regions. Subsequently, the metallic layers (the source electrode SE1 and the drain electrode DE1) are formed to come into contact with the amorphous regions, respectively. Hereinafter, details of the method will be described. In addition, in the drawings referenced by the following description, notation of the nitride semiconductor layer NS1 is omitted.

First, the semiconductor substrate SB1 is prepared. Here, a diameter of the semiconductor substrate SB1 is, for example, equal to or more than 6 inches. According to this configuration, a plurality of the semiconductor devices SM1 may be formed at the same time in the same semiconductor substrate SB1.

Figure 2A:
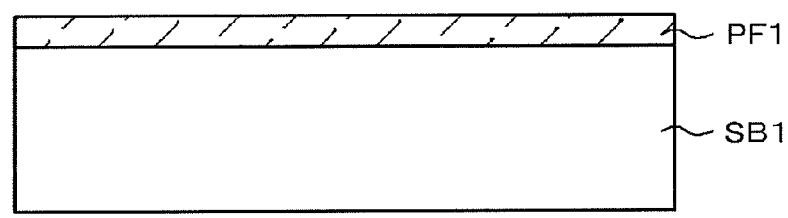
FIGS. 2A and 2B represent cross-sectional diagrams illustrating a method of manufacturing the semiconductor device related to the first embodiment.

As represented in FIG. 2A, the semiconductor substrate SB1 comprises the nitride semiconductor layer NS1 formed on one surface of the underlying substrate FD1. Here, the nitride semiconductor layer NS1 is formed from, for example, GaN. Subsequently, a protective layer PF1 is formed on the semiconductor substrate SB1. Here, for example, the protective layer PF1 is formed by oxidizing a surface of the semiconductor substrate SB1. Specifically, the protective layer PF1 is formed from, for example, $Ga_2O_3$. In addition, the protective layer PF1 may be formed by sputtering or the like.

Subsequently, as described below, an impurity of a first conductivity type is implanted to the semiconductor substrate SB1 including the nitride semiconductor layer NS1 formed from a nitride semiconductor on at least one surface side to form amorphous impurity regions (the source region SR1, the drain region DR1, and the like) (an impurity region forming process). In the impurity region forming process, a portion of the semiconductor substrate SB1 to which the impurity of the first conductivity type is implanted enters an amorphous state. Therefore, the amorphous impurity regions are formed.

Figure 2B:
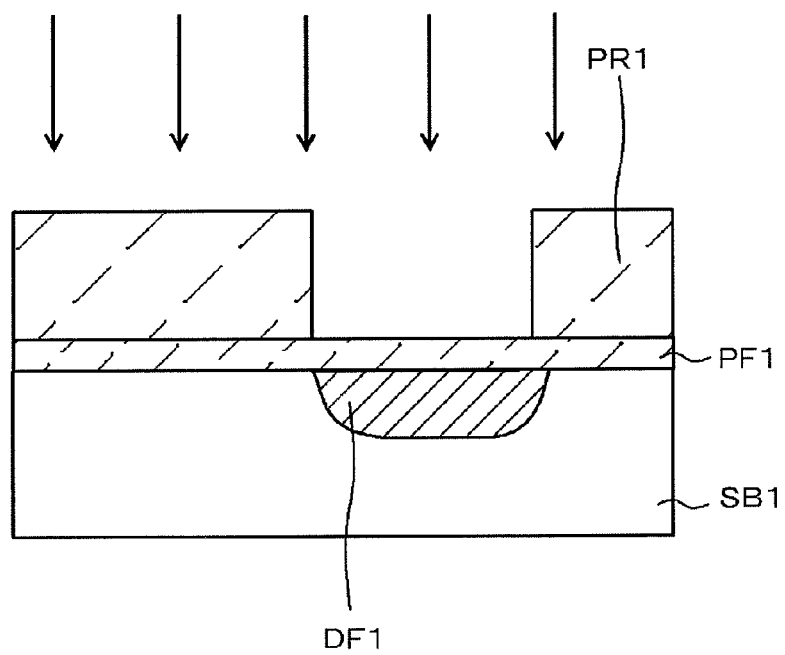

As represented in FIG. 2B, a photoresist layer PR1 is formed on the protective layer PF1. Subsequently, an opening (a reference numeral thereof is not shown) of the photoresist layer PR1 is formed by exposure and development, for example, in a region in which drift region DF1 is formed in a plan view. Subsequently, an n-type impurity is implanted to the opening by an ion implantation device. At this time, an impurity implantation amount, an acceleration voltage, and the like are adjusted so that an impurity concentration of the drift region DF1 becomes lower than that of the source region SR1 and the drain region DR1, and the depth of the drift region DF1 becomes shallower than that of the source region SR1 and the drain region DR1. Specifically, the acceleration voltage during forming the drift region DF1 is, for example, equal to or more than 1 keV and less than 20 keV. In addition, a dose amount during forming the drift region DF1 is, for example, equal to more than $5 \times 10^{12}$ $cm^{-2}$ and equal to or less than $5 \times 10^{15}$ $cm^{-2}$. Here, Si is implanted as the n-type impurity. Subsequently, for example, the photoresist layer PR1 is removed by ashing or the like.

Figure 3A:
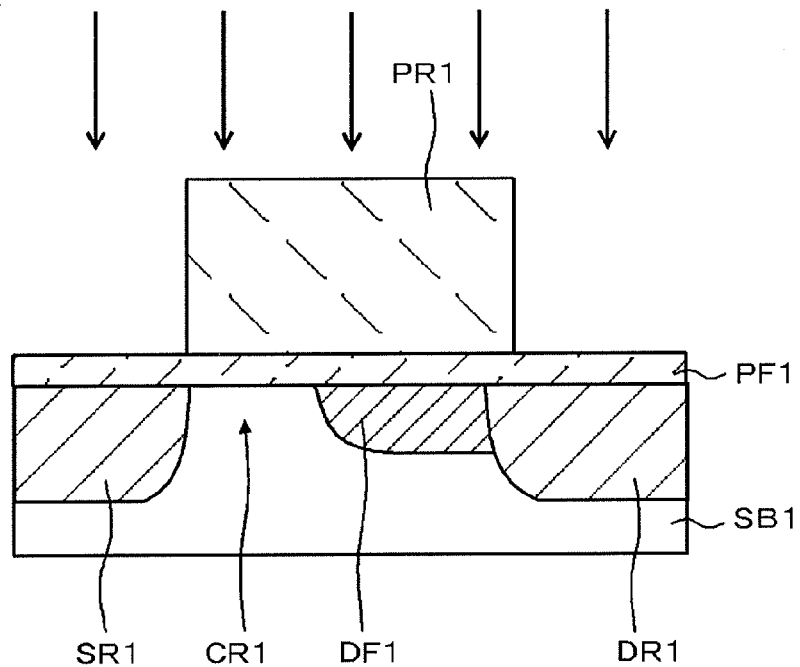
FIGS. 3A and 3B represent cross-sectional diagrams illustrating the method of manufacturing the semiconductor device related to the first embodiment.

Here, as represented in FIG. 3A, the photoresist layer PR1 is formed again on the protective layer PF1. Subsequently, openings (a reference numeral thereof is not shown) of the photoresist layer PR1 are formed in regions in which source region SR1 and drain region DR1 are formed in a plan view by exposure and development. Subsequently, Si is implanted to the openings as the n-type impurity. At this time, the impurity implantation amount, the acceleration voltage, and the like are adjusted so that the impurity concentration and the depth of the source region SR1 and the drain region DR1 satisfy the relationship with the drift region DF1.

In this impurity region forming process, the impurity is implanted at the acceleration voltage of equal to or more than 1 keV and less than 100 keV so as to form the impurity regions having the amorphous regions. According to this process, the amorphous regions may be stably formed on the surface layers of the impurity regions. Here, the acceleration voltage during forming the source region SR1 and the drain region DR1 is, for example, equal to or more than 10 keV and less than 100 keV.

In addition, the dose amount during forming the source region SR1 and the drain region DR1 is higher than that of the drift region DF1. Specifically, the dose amount during forming the source region SR1 and the drain region DR1 is, for example, equal to or more than $1 \times 10^{15}$ $cm^{-2}$ and equal to or less than $5 \times 10^{16}$ $cm^{-2}$. In this manner, the source region SR1 is formed at a position spaced apart from the drift region DF1. In addition, the drain region DR1 is formed to come into contact with the drift region DF1 on a side opposite to the source region SR1. Subsequently, the photoresist layer PR1 is removed, for example, by ashing or the like. As described above, in the impurity region forming process, the source region SR1 that is a first of the impurity region, and the drain region DR1 that is a second of the impurity region located at a position spaced from the source region SR1 in a plan view are formed in the semiconductor substrate SB1 (the nitride semiconductor layer NS1), respectively.

Figure 3B:
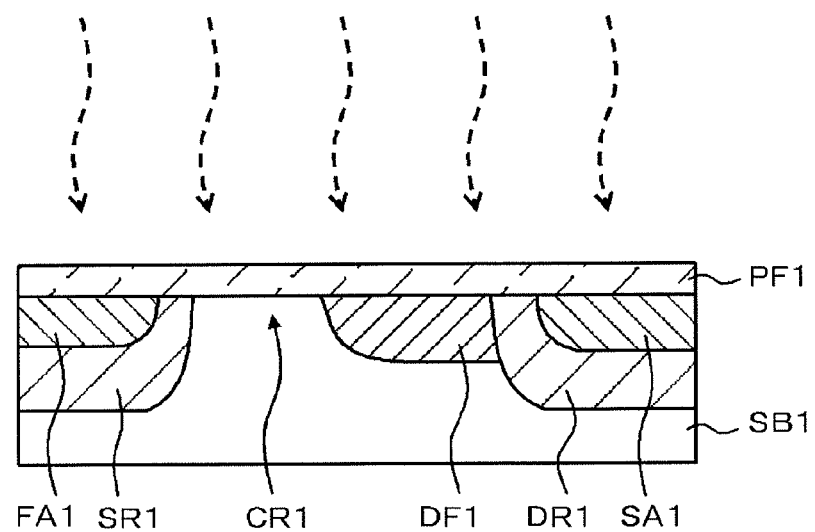

Subsequently, as represented in FIG. 3B, the semiconductor substrate SB1 is annealed under a condition in which amorphous regions remain in a part of the impurity regions (an annealing process). According to this process, an impurity in the impurity regions is activated, and the amorphous regions are formed on the surface layers of the impurity regions. That is, in the impurity regions in an amorphous state, portions in which a crystal state is not recovered by the annealing treatment and a crystal defect remain become the amorphous regions (the first amorphous region FA1 and the second amorphous region SA1). The amorphous regions are formed in the surface layer portions of the impurity regions.

In this annealing process, the first amorphous region FA1 and the second amorphous region SA1 are formed on the surface layers of the source region SR1 and the drain region DR1, respectively.

Here, the annealing treatment is performed, for example, by Rapid Thermal Annealing (RTA) or the like. In addition, a dotted line in the drawing schematically represents infrared rays during lamp heating.

In this annealing process, the annealing treatment is performed at a temperature equal to or higher than 1,000° C. and less than 1,300° C. Here, in a case where the crystal defect is generated by ion implantation to the nitride semiconductor, when the annealing treatment at a temperature equal to or higher than 1,300° C. is not performed, the crystallinity of the nitride semiconductor is not recovered. Therefore, the crystal defect due to the ion implantation is positively made to remain by performing the annealing treatment at the temperature within the above-described range. As a result, the amorphous regions may be stably formed on the surface layers of the impurity regions.

In addition, it is very difficult to perform the annealing treatment at a temperature equal to or higher than 1,300° C. in a stable and uniform in-plane manner. In addition, it is particularly difficult to perform the annealing treatment at a temperature equal to or higher than 1,300° C. in a stable and in-plane uniform manner with respect to the semiconductor substrate SB1 having a diameter equal to or more than 6 inches. As described above, the impurity regions that come into ohmic contact with the metallic layers through the amorphous regions may be obtained by the annealing treatment at a relatively low temperature. Therefore, this annealing treatment is particularly effective in a case where the diameter of the semiconductor substrate SB1 is equal to or more than 6 inches.

The annealing treatment may be performed in a state where the main surface of the semiconductor substrate SB1 is covered with the protective layer PF1 as represented in FIG. 3B. According to this, leakage of nitrogen in the semiconductor substrate SB1 may be suppressed.

Subsequently, the protective layer PF1 is removed by plasma etching or wet etching. In addition, the protective layer PF1 may be removed before the above-described annealing process, and then the annealing process may be performed.

Figure 4A:
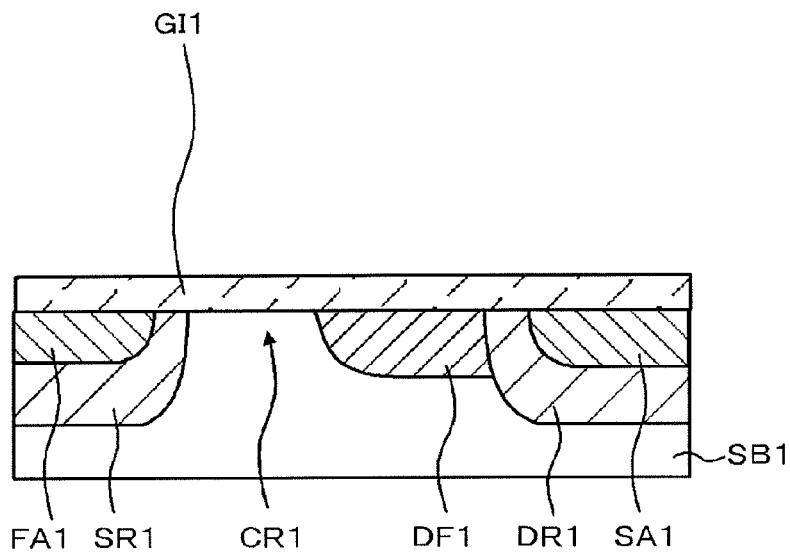
FIGS. 4A and 4B represent cross-sectional diagrams illustrating the method of manufacturing the semiconductor device related to the first embodiment.

Subsequently, as represented in FIG. 4A, on the one surface of the semiconductor substrate SB1, the gate insulating layer GI1 is formed to overlap at least the channel region CR1 that is a region interposed between the source region SR1 and the drain region DR1 in a plan view. Here, for example, the gate insulating layer GI1 is formed on the entire surface of the semiconductor substrate SB1 by sputtering. When the gate insulating layer GI1 is formed by sputtering, the gate insulating layer GI1 having a superior film quality may be formed. For example, SiN is formed as the gate insulating layer GI1.

In addition, the gate insulating layer GI1 may be formed before the impurity forming process, and this gate insulating layer GI1 may be used as the protective layer PF1.

Figure 4B:
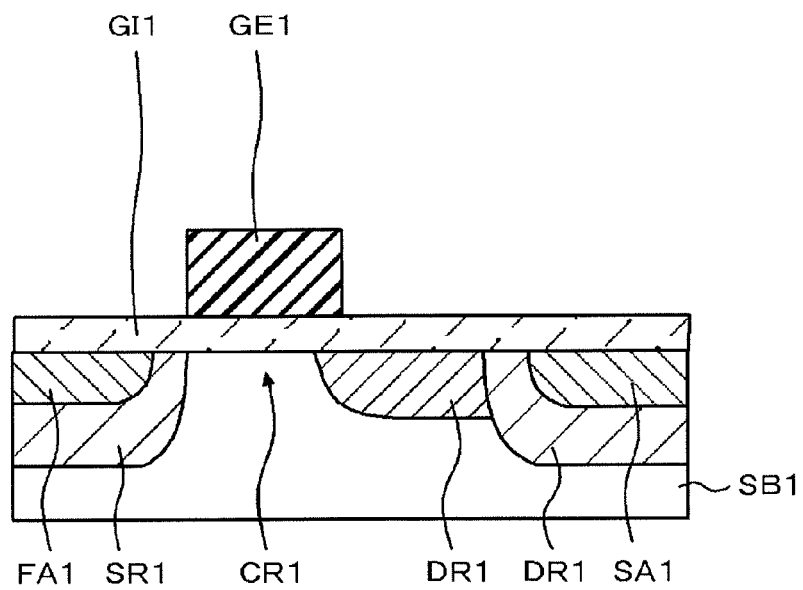

Subsequently, as represented in FIG. 4B, a metallic film for gate electrode is formed on the gate insulating layer GI1 by sputtering. For example, titanium silicide is formed as the metallic film. Subsequently, a photoresist layer (not shown) is formed on the metallic film. The photoresist layer is patterned by exposure and development in such a manner that the photoresist layer remains at least in a position overlapping the channel region CR1 in a plan view. The metallic film is etched by plasma etching or wet etching using the photoresist layer as a mask. Subsequently, for example, the photoresist layer is removed, for example, by ashing. In this manner, the gate electrode GE1 is formed on the gate insulating layer GI1 to come into contact with the gate insulating layer GI1. In addition, the gate electrode GE1 composed of titanium silicide may be formed by silicidizing Ti after patterning Ti.

Figure 5A:
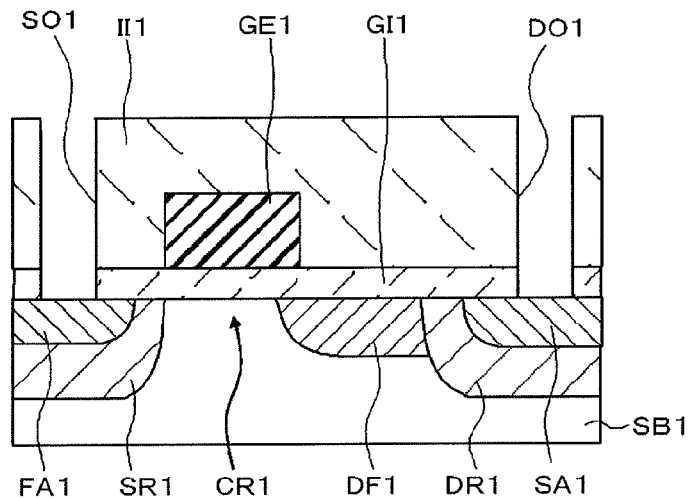
FIGS. 5A and 5B represent cross-sectional diagrams illustrating the method of manufacturing the semiconductor device related to the first embodiment.

Next, as represented in FIG. 5A, the insulating interlayer II1 is formed on the gate insulating layer GI1 and the gate electrode GE1, for example, by CVD. As the insulating interlayer II1, for example, a film of $SiO_2$, SiN, SiON, SiOC, SiOCH, SiCOH, or SiOF is formed.

Subsequently, a source opening SO1 is formed by Reactive Ion Etching (RIE) at a position overlapping the source region SR1 in a plan view to penetrate through the insulating interlayer II1 and the gate insulating layer GI1 so as to expose the upper surface of the source region SR1. Simultaneously, a drain opening DO1 is formed by RIE at a position overlapping the drain region DR1 in a plan view to penetrate through the insulating interlayer II1 and the gate insulating layer GI1 so as to expose the upper surface of the drain region DR1.

Figure 5B:
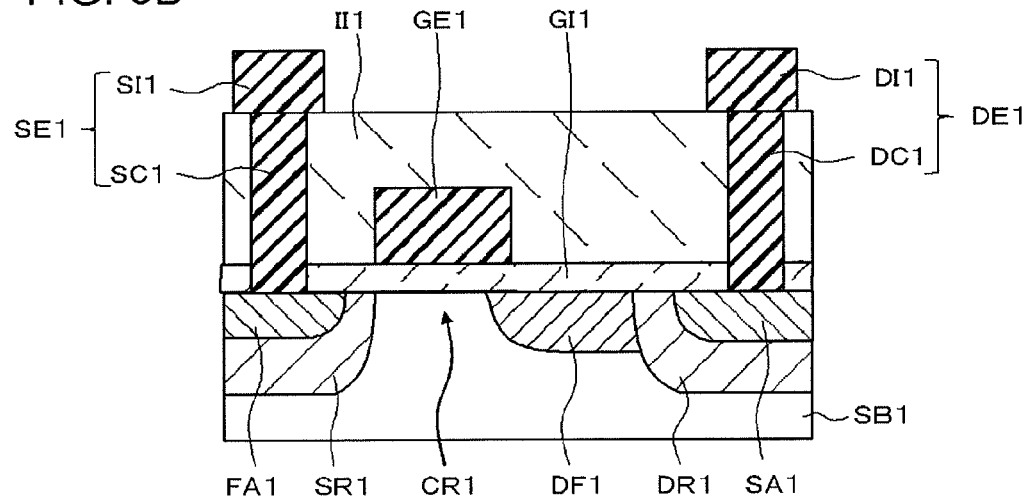

Subsequently, as represented in FIG. 5B, metallic layers are formed on side surfaces and bottom surfaces of the source opening SO1 and the drain opening DO1, and on the insulating interlayer II1, for example, by sputtering. Specifically, single layer films, laminated films, or the like, which contain, for example, at least one or more materials selected from a group consisting of Ti, Al, Mo, W, Ru, Au, and V, are formed as the metallic layers. Here, for example, as the metallic layers, Al films are formed by sputtering. Subsequently, a photoresist layer (not shown) is formed on the metallic layers. Subsequently, the photoresist layer is patterned by exposure and development in such a manner the photoresist layer remains at least at positions overlapping the source region SR1 and the drain region DR1 in a plan view. The metallic layers are etched by plasma etching or wet etching using the photoresist layer as a mask. Subsequently, the photoresist layer is removed, for example, by ashing. In this manner, the source electrode SE1 and the drain electrode DE1 are formed.

In the source electrode SE1, a portion that is located in the source opening SO1 becomes the source contact SC1 and a portion that is located on the insulating interlayer II1 becomes the source interconnection SI1. In addition, in the drain electrode DE1, a portion that is located in the drain opening DO1 becomes the drain contact DC1, and a portion that is located on the insulating interlayer II1 becomes the drain interconnection DI1.

Then, a multi-layered interconnection structure (not shown) may be formed on the insulating interlayer II1 by a damascene method. In addition, an electrode pad (not shown) may be formed on the uppermost layer of the multi-layered interconnection structure.

In this manner, the semiconductor device SM1 related to the first embodiment may be obtained. In addition, description was made with respect to a case in which the gate electrode GE1 is formed after the impurity region forming process, but a reverse order may be possible.

Next, an effect of the first embodiment will be described.

The nitride semiconductor has an insulation breakdown electric field higher than that of Si by approximately 10 times and has a bandgap wider than that of Si by three times. Therefore, nitride semiconductor has a high-temperature resistance and has a high withstanding voltage even in the semiconductor device SM1 that is miniaturized. In addition, compared to Si, the nitride semiconductor has a high electron saturation velocity and a high electron mobility using a heterointerface. Therefore, the nitride semiconductor is suitable for a power semiconductor in which low loss and high withstanding voltage are required. However, so as to form the miniaturized low-loss semiconductor device SM1, a decrease in parasitic resistance at a portion other than the channel region CR1 in charge of a switching operation becomes problematic.

In a case of forming impurity regions in a layer formed from a nitride semiconductor, the impurity regions are formed, for example, by ion implantation of an impurity. In this case, an annealing treatment is necessary to activate the impurity. At this time, when the annealing treatment is performed, for example, at a high temperature equal to or higher than 1,300° C., a nitride semiconductor atom is substituted with an impurity atom and thus crystallinity of the nitride semiconductor is further recovered. In this manner, a contact resistance between the impurity regions and the metallic layers may be lowered.

However, the present inventors found that in a case where a crystal defect due to ion implantation to a layer formed from a nitride semiconductor is present, the impurity regions may be brought into ohmic contact with the metallic layers. According to the first embodiment, on the surface layers of the impurity regions, the amorphous regions are formed as a part of the impurity regions. Therefore, the contact resistance between the metallic layers and the amorphous regions may be lowered.

In addition, the amorphous regions in the first embodiment may be formed by a low-temperature annealing treatment at a temperature lower than 1,300° C. Therefore, a semiconductor substrate SB1, which is not appropriate for the high-temperature treatment, may be used. In addition, an annealing treatment in which a temperature distribution is uniform may be easily performed with respect to the semiconductor substrate SB1 having a large surface area. Therefore, the manufacturing cost of the semiconductor device SM1 may be lowered.

As described above, according to the first embodiment, it is possible to provide the semiconductor device SM1 in which a parasitic resistance is lowered, and thus low loss is realized.

Second Embodiment

Figure 6:
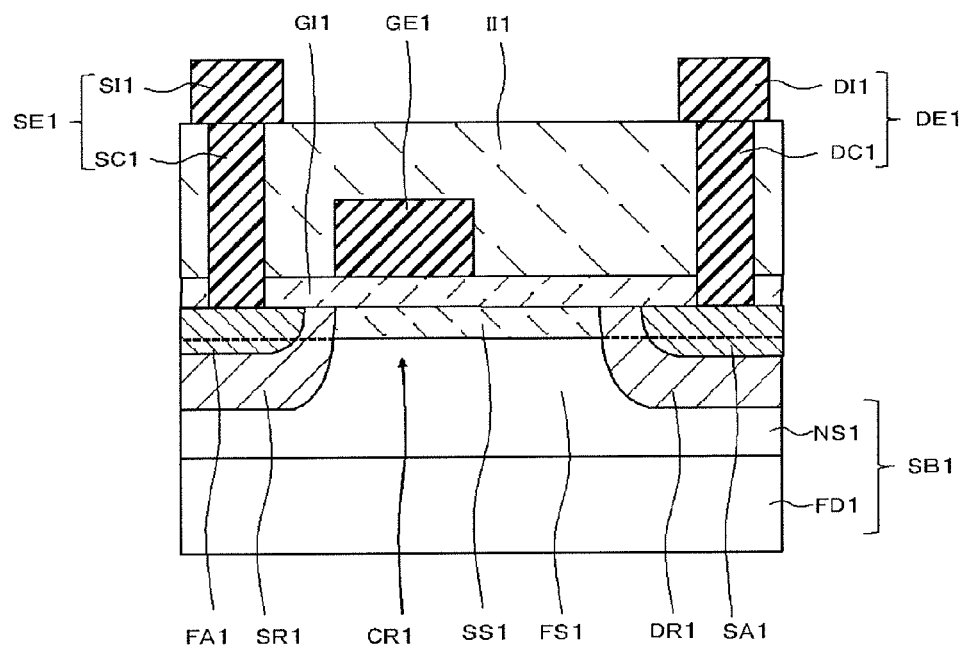
FIG. 6 represents a cross-sectional diagram illustrating a configuration of a semiconductor device related to a second embodiment.

FIG. 6 represents a cross-sectional diagram illustrating a configuration of a semiconductor device SM2 related to a second embodiment. The semiconductor device SM2 related to the second embodiment has the same configuration as the semiconductor device SM1 related to the first embodiment except that the nitride semiconductor layer NS1 includes a first semiconductor layer FS1 and a second semiconductor layer SS1 having bandgaps different from each other. Hereinafter, details thereof will be described.

As represented in FIG. 6, the nitride semiconductor layer NS1 includes the first semiconductor layer FS1, and the second semiconductor layer SS1 that is provided on the first semiconductor layer FS1, is located on the one surface side of the semiconductor substrate SB1, and has a bandgap larger than that of the first semiconductor layer FS1. In addition, the first semiconductor layer FS1 and the second semiconductor layer SS1 are nitride semiconductors. According to this configuration, a heterointerface is formed at the interface between the first semiconductor layer FS1 and the second semiconductor layer SS1. Therefore, since the heterointerface is formed, in the first semiconductor layer FS1, a two-dimensional electron gas is excited in the vicinity of the interface with the second semiconductor layer SS1. That is, the two-dimensional-electron gas is excited in the vicinity of a surface layer of the channel region CR1. The "two-dimensional electron gas" described here represents a state in which electrons are two-dimensionally distributed in a semiconductor. The mobility of an electron in the "two-dimensional electron gas" is higher than that of an electron that is three-dimensionally distributed by impurity doping. In this manner, when the two-dimensional electron gas is excited in the channel region CR1, it is possible to obtain the semiconductor device SM2 in which a switching speed is fast.

In addition, the first semiconductor layer FS1 is formed from, for example, GaN. In addition, the second semiconductor layer SS1 is formed from, for example, AlGaN. Among these, a compositional ratio of Al with respect to Ga is, for example, equal to or more than 0.5 atom % and equal to or less than 40 atom %, preferably equal to or more than 10 atom % and equal to or less than 30 atom %, and more preferably equal to or more than 15 atom % and equal to or less than 30 atom %. According to this compositional ratio, the two-dimensional electron gas layer having a concentration sufficient for improving the switching speed may be realized, and an increase in contact resistance may be suppressed.

The second semiconductor layer SS1 may be a non-doped type or may be doped with an impurity. In addition, the thickness of the second semiconductor layer SS1 formed from AlGaN is, for example, equal to or more than 1 nm and equal to or less than 50 nm, preferably equal to or more than 10 nm and equal to or less than 40 nm, and more preferably equal to or more than 15 nm and equal to or less than 40 nm. According to this thickness, a heterointerface may be easily formed. Therefore, the two-dimensional electron gas may be excited in the first semiconductor layer FS1 formed from GaN.

In addition, an electron concentration of the two-dimensional electron gas in the first semiconductor layer FS1 is, for example, equal to or more than $5 \times 10^{10}$ cm$^{-2}$ and equal to or less than $4 \times 10^{13}$ cm$^{-2}$.

In addition, similarly to the first embodiment, a p-type impurity may be contained in the nitride semiconductor layer NS1. In addition, for example, a p-type impurity in the nitride semiconductor layer NS1 may be present in a so-called retrograde distribution. According to this, a short channel effect is suppressed, and the semiconductor device SM2 may be miniaturized.

N-type source region SR1 and drain region DR1, which are impurity regions, are formed in the nitride semiconductor layer NS1. In addition, in the second embodiment, the drift region DF1 is not provided.

The impurity regions are formed in regions including a part of the second semiconductor layer SS1 and a part of the first semiconductor layer FS1 from the main surface side of the semiconductor substrate SB1, respectively. The first amorphous region FA1 and the second amorphous region SA1 are formed in surface layers of the source region SR1 and the drain region DR1, respectively. For example, the amorphous regions (the first amorphous region FA1 and the second amorphous region SA1) are formed in regions including a part of the second semiconductor layer SS1 and a part of the first semiconductor layer FS1 from the surface layers of the impurity regions, respectively. That is, the amorphous regions are formed across the second semiconductor layer SS1 and the first semiconductor layer FS1. On the other hand, the amorphous regions may be formed only in the second semiconductor layer SS1.

In addition, the gate insulating layer GI1 is provided on at least the channel region CR1 that is a region interposed between the source region SR1 and the drain region DR1 in a plan view. Here, for example, the gate insulating layer GI1 is formed to come into contact with the entirety of the nitride semiconductor layer NS1.

Here, the source electrode SE1 and the drain electrode DE1 that are metallic layers come into contact with the source region SR1 and the drain region DR1 through openings (a reference numeral thereof is not shown) formed in the gate insulating layer GI1, respectively.

Other configurations of the second embodiment are the same as the first embodiment.

A method of manufacturing the semiconductor device SM2 related to the second embodiment is the same as the first embodiment except for the following configurations.

The semiconductor substrate SB1 is prepared in a process before a process represented in FIG. 2A. Here, the first semiconductor layer FS1 formed from GaN is epitaxially grown on the underlying substrate FD1 formed from Si, for example, by MOCVD. Subsequently, the second semiconductor layer SS1 formed from AlGaN is epitaxially grown on the first semiconductor layer FS1 by MOCVD.

The subsequent processes are the same as the first embodiment.

According to the second embodiment, the same effect as the first embodiment may be obtained. Furthermore, according to the second embodiment, the nitride semiconductor layer NS1 includes the first semiconductor layer FS1 and the second semiconductor layer SS1 having bandgaps different from each other. Therefore, the two-dimensional electron gas is excited at the heterointerface between the first semiconductor layer FS1 and the second semiconductor layer SS1. Therefore, a channel resistance of the semiconductor device SM2 may be decreased.

Hereinbefore, in the second embodiment, description was made with respect to a case in which the second semiconductor layer SS1 is formed from AlGaN, but the material is not limited to AlGaN as long as the material is capable of exciting the two-dimensional electron gas.

Third Embodiment

Figure 7:
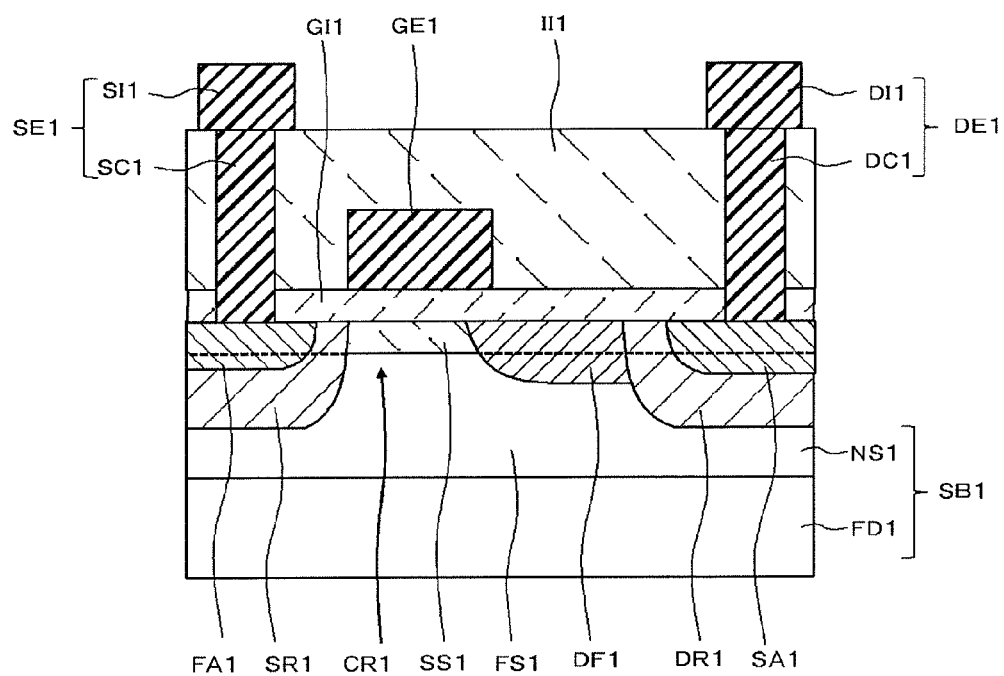
FIG. 7 represents a cross-sectional diagram illustrating a configuration of a semiconductor device related to a third embodiment.

FIG. 7 represents a cross-sectional diagram illustrating a configuration of a semiconductor device SM3 related to a third embodiment. The semiconductor device SM3 related to the third embodiment has a same configurations as the semiconductor device SM2 related to the second embodiment except that a drift region DF1 is further formed. Hereinafter, details thereof will be described.

As represented in FIG. 7, n-type source regions SR1, drift region DF1, and drain region DR1 are provided in the nitride semiconductor layer NS1. For example, the drift region DF1 has the same configuration as the first embodiment.

Other configurations are the same as the second embodiment.

In addition, an electron concentration of the two-dimensional electron gas in the first semiconductor layer FS1 is, for example, equal to or more than $5 \times 10^9$ cm$^{-2}$ and equal to or less than $4 \times 10^{13}$ cm$^{-2}$. In addition, the electron concentration is preferably, for example, equal to or more than $5 \times 10^9$ cm$^{-2}$ and equal to or less than $5 \times 10^{11}$ cm$^{-2}$. When the electron concentration is within the above-described range, a threshold voltage may be increased.

According to the third embodiment, the same effect as the second embodiment may be obtained.

In addition, according to the third embodiment, the drift region DF1 is provided. Here, similarly to the second embodiment, in a case where in the first semiconductor layer FS1, the two-dimensional electron gas is excited in the vicinity of the interface with the second semiconductor layer SS1, the threshold voltage has a tendency to decrease. So as to increase the threshold voltage, for example, it is considered to decrease the compositional ratio of Al in the second semiconductor layer SS1 formed from AlGaN. However, in a case of decreasing the compositional ratio of Al in the second semiconductor layer SS1, the electron concentration in the two-dimensional electron gas decreases, and thus a parasitic resistance may be increased. Therefore, similarly to the third embodiment, when the drift region DF1 is provided, the threshold voltage may be raised and the semiconductor device SM3 in which loss is low may be provided.

Fourth Embodiment

Figure 8:
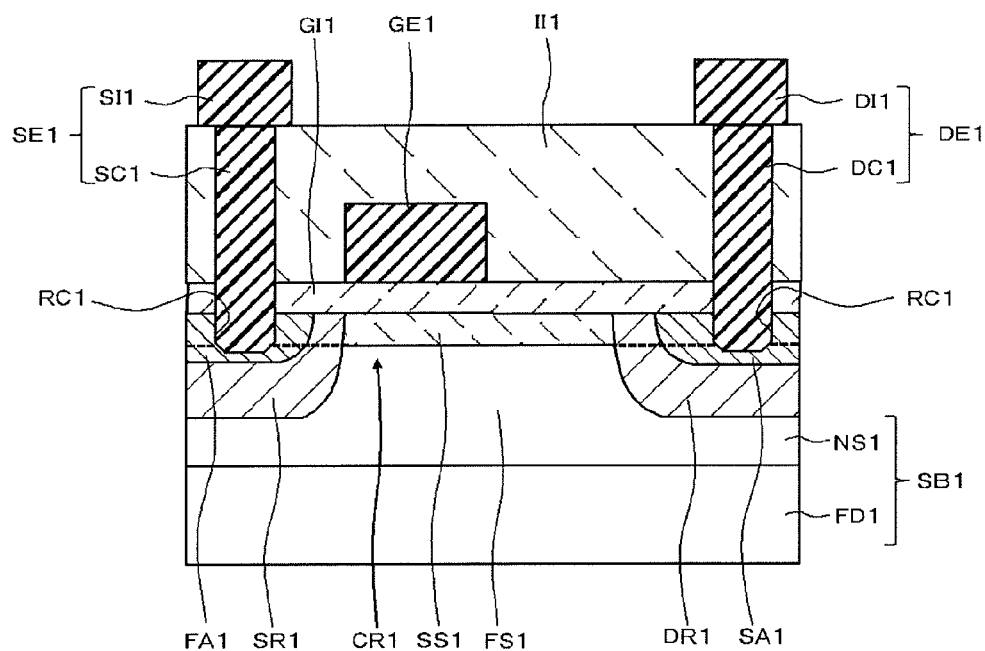
FIG. 8 represents a cross-sectional diagram illustrating a configuration of a semiconductor device related to a fourth embodiment.

FIG. 8 represents a cross-sectional diagram illustrating a semiconductor device SM4 related to a fourth embodiment. The semiconductor device SM4 related to the fourth embodiment has the same configuration as the semiconductor device SM2 related to the second embodiment except for a configuration of the metallic layers that come into contact with the amorphous regions. Hereinafter, description will be made in detail.

As represented in FIG. 8, recesses RC1 are formed in surfaces of the amorphous regions. A part of each of the metallic layers that come into contact with the amorphous regions is located in each of the recesses RC1. In this embodiment, the recesses RC1 are formed in the surface of the first amorphous region FA1 and the surface of the second amorphous region SA1, respectively. In addition, a lower end portion of the source contact SC1 of the source electrode SE1 is located in the recess RC1 formed in the first amorphous region FA1. In addition, a lower end portion of the drain contact DC1 of the drain electrode DE1 is located in the recess RC1 formed in the second amorphous region SA1.

In this manner, when a part of the metallic layer is located in the recess RC1 provided in the amorphous region, a contact area between the metallic layer and the amorphous region increases. Therefore, a decrease in contact resistance in the source region SR1 and the drain region DR1 may be realized.

In this embodiment, the first semiconductor layer FS1 is formed from GaN. In addition, the second semiconductor layer SS1 is formed from AlGaN.

For example, each of the amorphous regions is formed across the second semiconductor layer SS1 and the first semiconductor layer FS1. That is, the lower end of the amorphous region is located in the first semiconductor layer FS1.

For example, the recess RC1 penetrates the second semiconductor layer SS1 and reaches the first semiconductor layer FS1. Therefore, a part of the metallic layer located in the recess RC1 penetrates the second semiconductor layer SS1 and comes into contact with the first semiconductor layer FS1. That is, the source contact SC1 and the drain contact DC1 come into contact with the first semiconductor layer FS1.

In this manner, the source electrode SE1 and the drain electrode DE1 come into contact with the first semiconductor layer FS1 without passing through the second semiconductor layer SS1. Therefore, an increase in contact resistance and an increase in resistance of a diffused layer, which are caused by an effect of Al contained in the second semiconductor layer SS1, may be suppressed. In addition, a compositional ratio of Al with respect to Ga is increased sufficiently, and thus an electron concentration in the two-dimensional electron gas may be increased. Therefore, it is possible to realize a low-loss element.

In addition, for example, the recess RC1 may be provided only in the second semiconductor layer SS1 without penetrating through the second semiconductor layer SS1. In this case, a current path through which a carrier flows in the second semiconductor layer SS1 may be shortened. Therefore, a resistance inside the diffused layer is decreased, and thus a low-loss element may be realized.

In this embodiment, the metallic layers come into direct contact with the impurity regions without passing through another layer. That is, the source contact SC1 and the drain contact DC1 come into contact with the source region SR1 and the drain region DR1 without passing though another layer, respectively. In this case, since the metallic layers come into contact with the amorphous regions that are provided in the source region SR1 and the drain region DR1, the contact resistance in the source region SR1 and the drain region DR1 may be sufficiently decreased.

In addition, in this manner, when the contact resistance is decreased, a contact diameter may be made to be small and thus miniaturization of a transistor may be realized. Therefore, it is possible to form the semiconductor device SM4 as a product that has a minute structure and a low withstanding voltage. In this embodiment, in a case where the semiconductor device SM4 is a product with a low withstanding voltage, for example, the distance between the source region SR1 and the drain region DR1 may be set to be equal to or more than 0.2 µm and equal to or less than 5 µm.

Figure 9A:
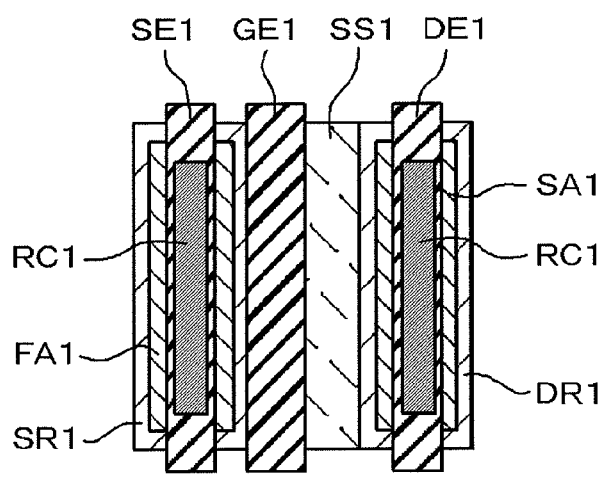
FIGS. 9A to 9C represent plan views illustrating the configuration of the semiconductor device represented in FIG. 8.
Figure 9B:
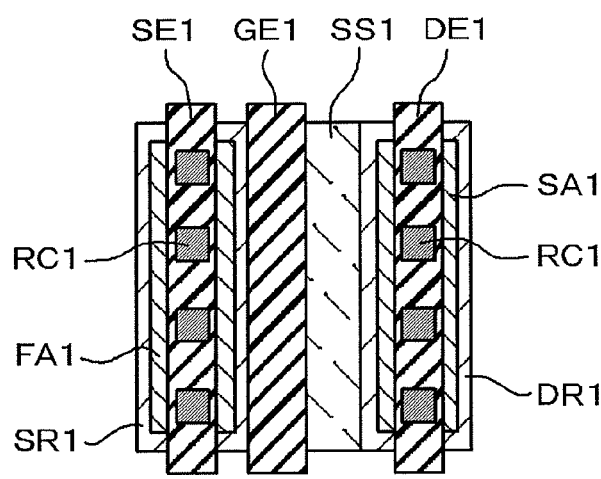
Figure 9C:
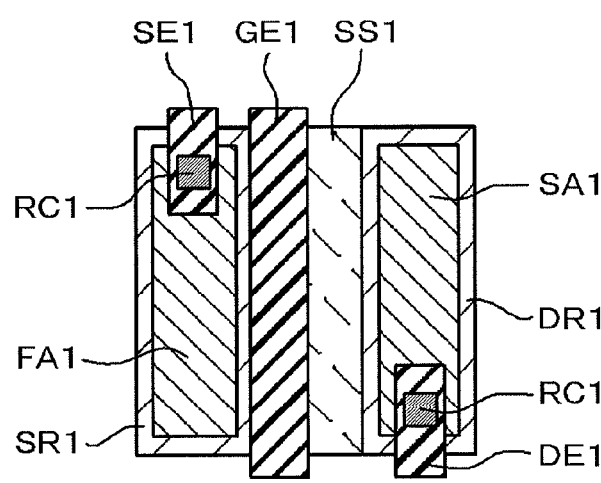

FIGS. 9A to 9C represent a plan view illustrating the configuration of the semiconductor device SM4 represented in FIG. 8. In addition, in FIGS. 9A to 9C, the insulating interlayer II1 and the gate insulating layer GI1 are not shown.

As represented in FIG. 9A, for example, the recess RC1 is provided in a groove shape that extends in one direction. In this embodiment, for example, the recess RC1 in the source region SR1 and the recess RC1 in the drain region DR1 are formed in a groove shape that extends in the same direction as an extending direction of the gate electrode GE1. In this case, for example, the source opening SO1 in which the source contact SC1 is buried and the drain opening DO1 in which the drain contact DC1 is buried are also formed in a groove shape that extends in the same direction as the extending direction of the gate electrode GE1.

As represented in FIG. 9B, for example, a plurality of the recess RC1 may be provided in the surfaces of the amorphous regions to be spaced apart from each other. In this case, the plurality of recesses RC1 that are provided in the source region SR1 are arranged in the same direction as the extending direction of the gate electrode GE1. In addition, the plurality of the recesses RC1 that are provided in the drain region DR1 are also arranged in the same direction as the extending direction of the gate electrode GE1.

In addition, as represented in FIG. 9C, the recess RC1 may be formed only in the surface of each of the amorphous regions of the source region SR1 and the drain region DR1.

Figure 10A:
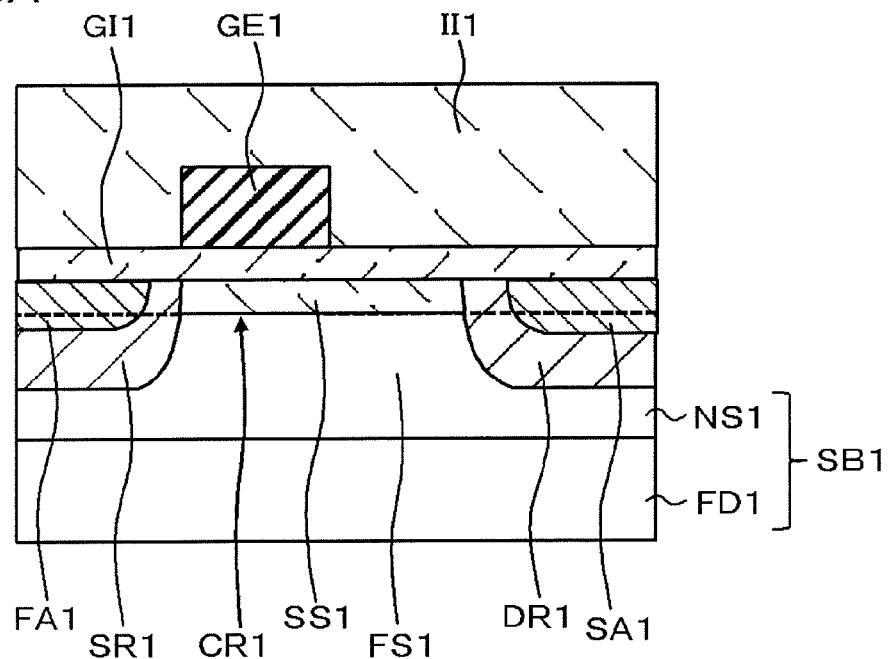
FIGS. 10A and 10B represent cross-sectional diagrams illustrating a method of manufacturing the semiconductor device related to the fourth embodiment.
Figure 10B:
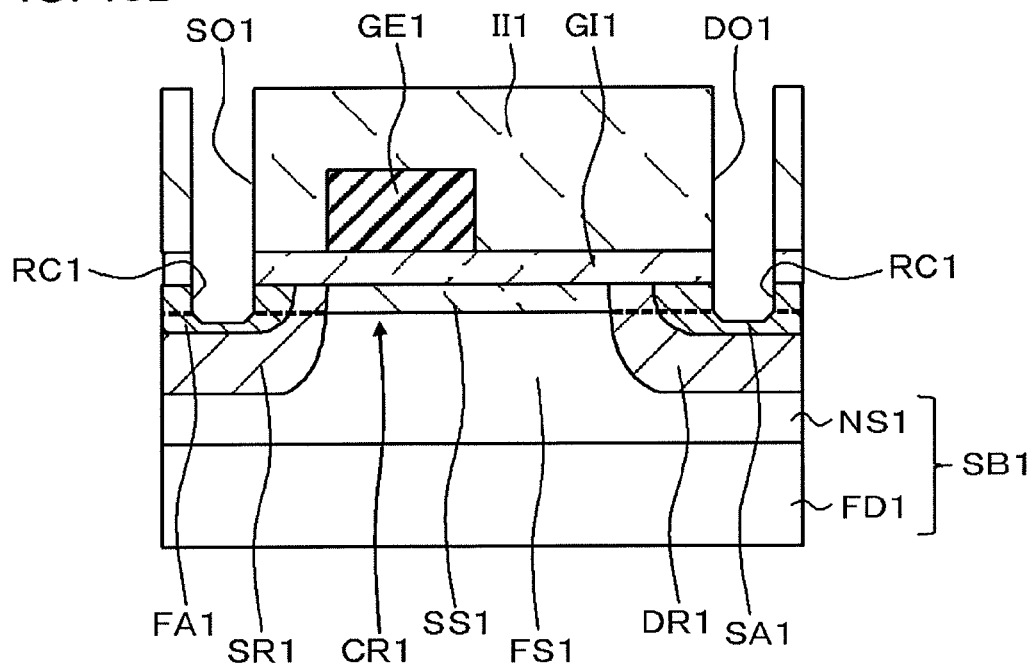

Next, a method of manufacturing the semiconductor device SM4 related to this embodiment will be described. FIGS. 10A and 10B represent cross-sectional diagrams illustrating the method of manufacturing the semiconductor device SM4 related to this embodiment.

The method of manufacturing the semiconductor device SM4 related to this embodiment is the same as the method of manufacturing the semiconductor device SM2 related to the second embodiment except that a process of forming the recess RC1 in the surface of the amorphous region is provided before a process of forming a metallic layer.

First, similarly to the method of manufacturing the semiconductor device SM2 related to the second embodiment, processes to the process of forming the insulating interlayer II1 are performed. As a result, a structure represented in FIG. 10A may be obtained.

Next, as represented in FIG. 10B, in the process of forming the source opening SO1 and the drain opening DO1 in the insulating interlayer II1 and the gate insulating layer GI1, the recess RC1 is formed in combination with the source opening SO1 and the drain opening DO1. In this embodiment, the source opening SO1 that comes into contact with the source region SR1 is formed under conditions of forming the recess RC1 in the first amorphous region FA1. In addition, the drain opening DO1 that comes into contact with the drain region DR1 is formed under conditions of forming the recess RC1 in the second amorphous region SA1.

In this manner, in this embodiment, the recess RC1 may be formed without increasing the number of processes. Therefore, a decrease in contact resistance may be realized while avoiding complication of a manufacturing process.

In addition, the formation of the source opening SO1 and the drain opening DO1 may be performed, for example, by Reactive Ion Etching (RIE).

In addition, a method of forming the recess RC1 is not limited to the above description. For example, the recess RC1 may be formed before the process of forming the amorphous impurity regions. In this case, the depth of the amorphous regions may be adjusted in accordance with the depth of the recess RC1. Therefore, the recess RC1 may be reliably located within the amorphous regions.

Subsequently, similarly to the second embodiment, the metallic layers (the source electrode SE1 and the drain electrode DE1) are formed. In the process of forming the metallic layers, the metallic layers are formed in such a manner that a part of each of the metallic layers is located within the recess RC1. According to this method, the semiconductor device SM4 may be obtained.

Figure 11:
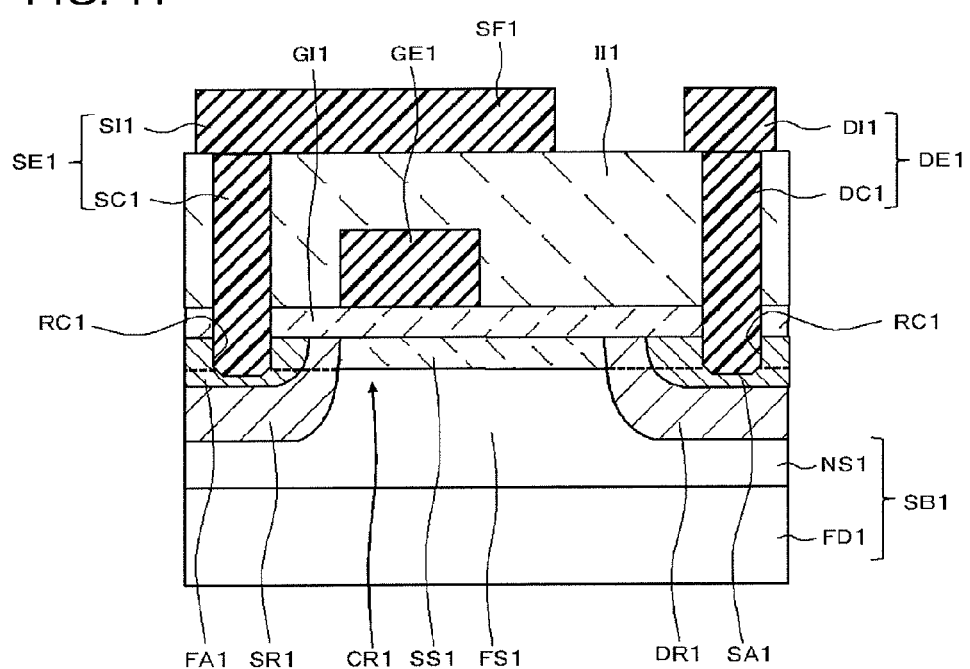
FIG. 11 represents a cross-sectional diagram illustrating a configuration of a modification example of the semiconductor device represented in FIG. 8.

FIG. 11 represents a cross-sectional diagram illustrating a configuration of a modification example of the semiconductor device SM4 represented in FIG. 8. The semiconductor device SM4 related to this modification example is provided with a source field plate electrode SF1.

The source field plate electrode SF1 is provided in such a manner that one end thereof is located between the gate electrode GE1 and the drain electrode DE1 in a plan view. When the source field plate electrode SF1 is formed in this manner, focusing of an electric field on an end portion of the gate electrode GE1 on the drain side may be mitigated. Therefore, a high withstanding voltage of an element may be realized.

The source field plate electrode SF1 is formed on the semiconductor substrate SB1 through an insulating film. In this embodiment, the source field plate electrode SF1 is formed on the semiconductor substrate SB1 through the gate insulating layer GI1 and the insulating interlayer II1.

In addition, the insulating film, which is located below the source field plate electrode SF1, may be a single layer film or a laminated film with three layers or more. For example, the insulating film, which is located below the source field plate electrode SF1, may be made up by only the insulating interlayer II1. In this case, the gate insulating layer GI1 around the gate electrode GE1 may be removed, for example, by etching.

The source field plate electrode SF1 comes into contact with the source electrode SE1. In this embodiment, the source field plate electrode SF1 is connected to the source interconnection SI1, and extends to a position between the gate electrode GE1 and the drain electrode DE1 from the source electrode SE1 side in a plan view. When the source field plate electrode SF1 comes into contact with the source electrode SE1 in this manner, an electric potential of the source field plate electrode SF1 may be maintained at the same electric potential as that of the source electrode SE1. Therefore, stabilization of element characteristics may be realized.

In addition, the source field plate electrode SF1 may be obtained by forming the source electrode SE1 in such a manner that a drain side end portion of the source interconnection SI1 is located between the gate electrode GE1 and the drain electrode DE1 in a plan view, for example, in the process of forming the source electrode SE1.

The length (hereinafter, also referred to as a "source field plate electrode length") of the source field plate electrode SF1 from a portion overlapping the drain side end portion of the gate electrode GE1 to one end that is located between the gate electrode GE1 and the drain electrode DE1 may be appropriately selected in correspondence with a drain withstanding voltage. In addition, the thickness (hereinafter, also referred to as a "source field plate insulating film thickness") of the insulating film that is located below the source field plate electrode SF1 may also be appropriately selected in correspondence with the drain withstanding voltage.

In the semiconductor device SM4 in which the drain withstanding voltage is approximately 600 V, and a drift length is approximately 10 μm, the source field plate electrode length is, for example, equal to or more than 0.5 μm and equal to or less than 5 μm. In addition, in this case, the source field plate insulating film thickness is, for example, equal to or more than 0.2 μm and equal to or less than 1 μm.

According to this embodiment, the same effect as the second embodiment may also be obtained.

In addition, according to this embodiment, a part of each of the metallic layers is located in the recess RC1 provided in the amorphous region. Therefore, a decrease in contact resistance in the source region and the drain region may be realized.

Fifth Embodiment

Figure 12:
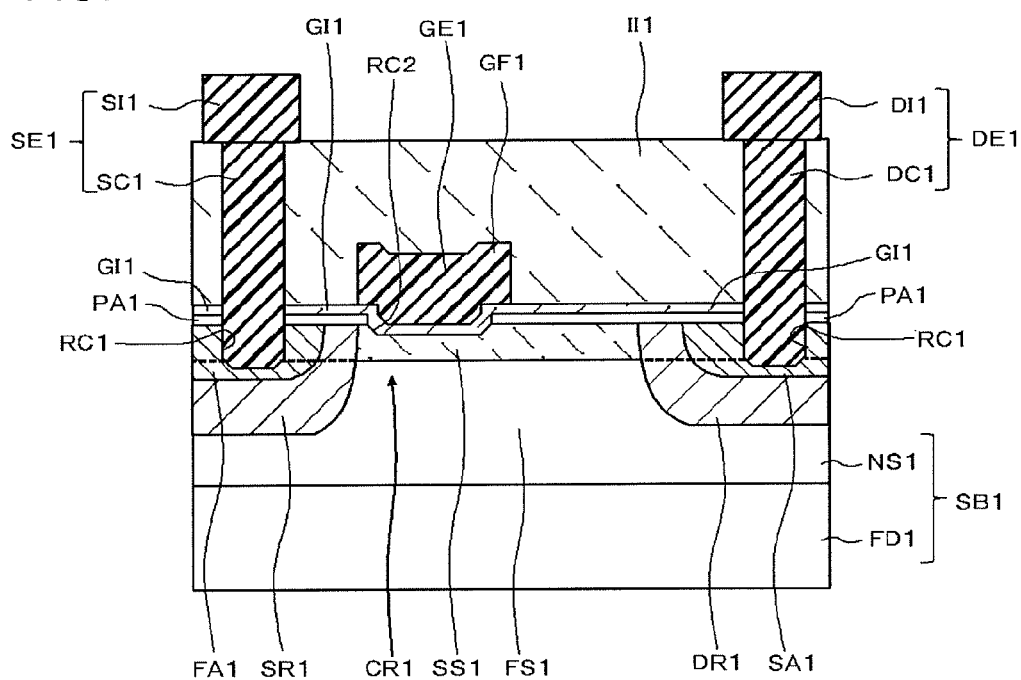
FIG. 12 represents a cross-sectional diagram illustrating a configuration of a semiconductor device related to a fifth embodiment.

FIG. 12 represents a cross-sectional diagram illustrating a configuration of a semiconductor device SM5 related to a fifth embodiment. The semiconductor device SM5 related to the fifth embodiment has the same configurations as the semiconductor device SM4 related to the fourth embodiment except that a gate field plate electrode GF1 is provided.

Hereinafter, description will be made in detail.

As represented in FIG. 12, the semiconductor device SM5 is provided with a gate field plate electrode GF1. The gate field plate electrode GF1 is connected to the gate electrode GE1. In addition, one end of the gate field plate electrode GF1 is located between the gate electrode GE1 and the drain electrode DE1 in a plan view. When the gate field plate electrode GF1 is formed in this manner, focusing of an electric field on an end portion of the gate electrode GE1 on the drain side may be mitigated. Therefore, a high withstanding voltage of an element may be realized.

In this embodiment, for example, the gate field plate electrode GF1 is formed integrally with the gate electrode GE1. An end portion, which extends on the drain side, of the gate electrode GE1 makes up the gate field plate electrode GF1.

The length (hereinafter, also referred to as a "gate field plate electrode length") of the gate field plate electrode GF1 from a portion that comes into contact with the drain side end portion of the gate electrode GE1 to one end that is located between the gate electrode GE1 and the drain electrode DE1 may be appropriately selected in correspondence with a drain withstanding voltage. In addition, the thickness (hereinafter, also referred to as a "gate field plate insulating film thickness") of the insulating film that is located below the gate field plate electrode GF1 may also be appropriately selected in correspondence with the drain withstanding voltage.

In the semiconductor device SM5 in which the drain withstanding voltage is approximately 600 V, and a drift length is approximately 10 μm, the gate field plate electrode length is, for example, equal to or more than 0.1 μm and equal to or less than 3 μm. In addition, in this case, the gate field plate insulating film thickness is, for example, equal to or more than 0.05 μm and equal to or less than 0.4 μm.

For example, a recess RC2 is formed in the second semiconductor layer SS1 in a portion that is located below the gate electrode GE1. The recess RC2 is formed in the second semiconductor layer SS1 in a portion that is located on the channel region CR1. Therefore, the second semiconductor layer SS1 becomes thin in a portion that is located on the channel region CR1. Therefore, the threshold voltage of a semiconductor element may be raised.

The film thickness of the second semiconductor layer SS1 in a portion that is located on the channel region CR1 may be appropriately designed by the threshold voltage of the semiconductor element. The film thickness is, for example, equal to or more than 1 nm and equal to or less than 40 nm, and preferably equal to or more than 1 nm and equal to or less than 10 nm.

For example, a passivation film PA1 is formed on the second semiconductor layer SS1. An opening is formed in the passivation film PA1 at a portion overlapping the recess RC2. The passivation film PA1 is formed from, for example, $SiO_2$ or $Si_3N_4$. The film thickness of the passivation film PA1 is, for example, equal to or more than 0.01 μm and equal to or less than 1 μm.

In addition, in this embodiment, the semiconductor device SM5 may not include the passivation film PA1.

The gate insulating layer GI1 is formed, for example, on the passivation film PA1. In this case, a part of the gate insulating layer GI1 is formed in the recess RC2 and in the opening formed in the passivation film PA1.

In addition, a part of the gate electrode GE1 is formed, for example, on the recess RC2. In this case, an end portion of the gate electrode GE1, which does not overlap the recess RC2 and is located on the drain side, makes up the gate field plate electrode GF1.

Next, a method of manufacturing the semiconductor device SM5 related to this embodiment will be described. FIGS. 13A to 14B represent cross-sectional diagram illustrating the method of manufacturing the semiconductor device SM5 related to this embodiment.

First, similarly to the fourth embodiment, processes to the process of forming the first amorphous region FA1 and the second amorphous region SA1 are performed. Subsequently, the passivation film PA1 is formed on the second semiconductor layer SS1. As a result, a structure represented in FIG. 13A may be obtained.

The passivation film PA1 is formed by forming a $SiO_2$ film or a $Si_3N_4$ film, for example, by a plasma CVD method. In addition, before forming the passivation film PA1, a surface of the second semiconductor layer SS1 may be cleaned using an aqueous persulfate solution.

Figure 13A:
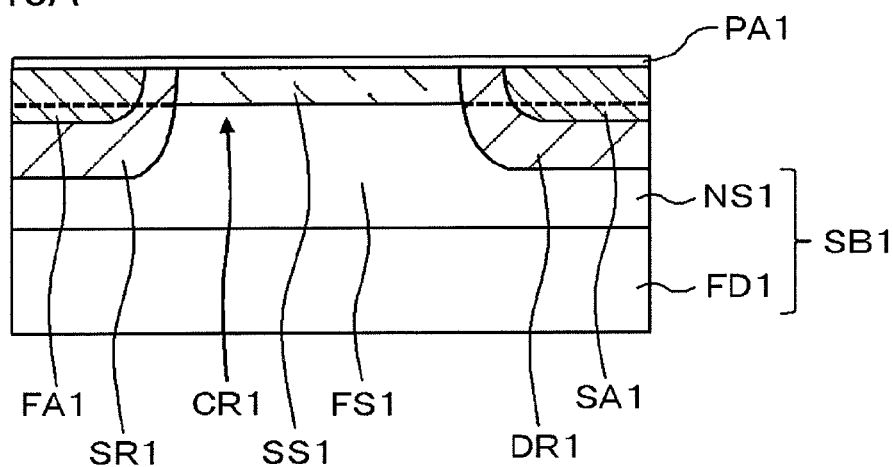
FIGS. 13A and 13B represent cross-sectional diagrams illustrating a method of manufacturing the semiconductor device related to the fifth embodiment.
Figure 13B:
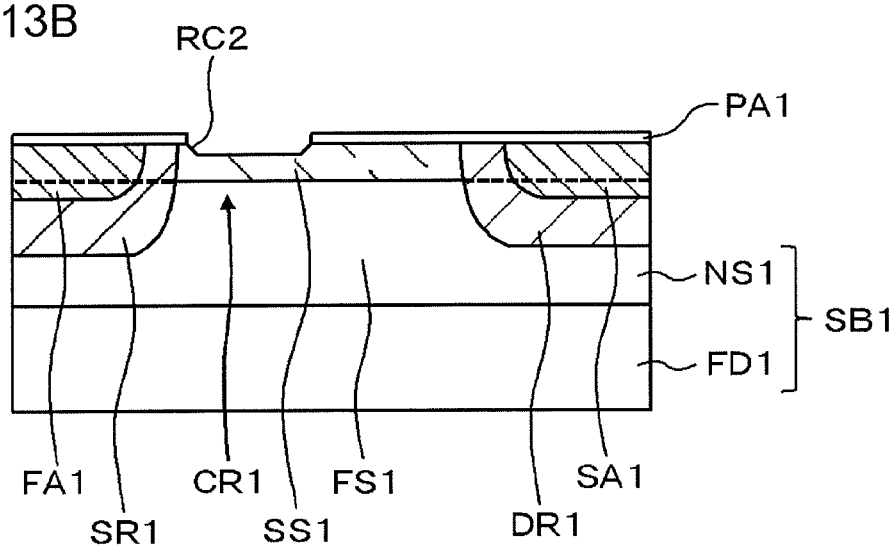

Subsequently, as represented in FIG. 13B, the recess RC2 is formed in the second semiconductor layer SS1. At this time, an opening is formed in the passivation film PA1 at a portion overlapping the recess RC2.

For example, the recess RC2 is formed by dry etching using a resist film as a mask. In this embodiment, the recess RC2 is formed by dry-etching the passivation film PA1 and the second semiconductor layer SS1 by using a resist film formed on the passivation film PA1 as a mask.

In addition, in the etching process, a surface of the second semiconductor layer SS1 that is located on the channel region CR1 may be exposed, and the recess RC2 may not be formed.

Figure 14A:
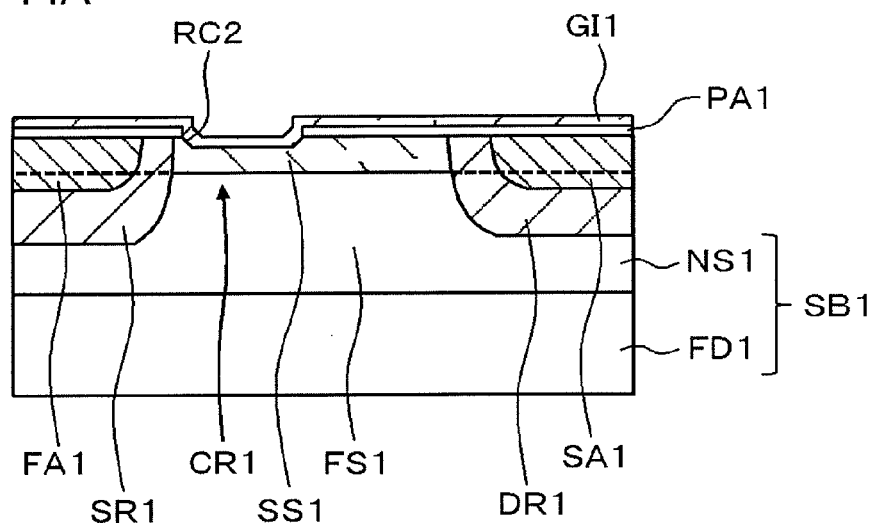
FIGS. 14A and 14B represent cross-sectional diagrams illustrating the method of manufacturing the semiconductor device related to the fifth embodiment.

Subsequently, as represented in FIG. 14A, the gate insulating layer GI1 is formed on the passivation film PA1 and in the recess RC2.

Figure 14B:
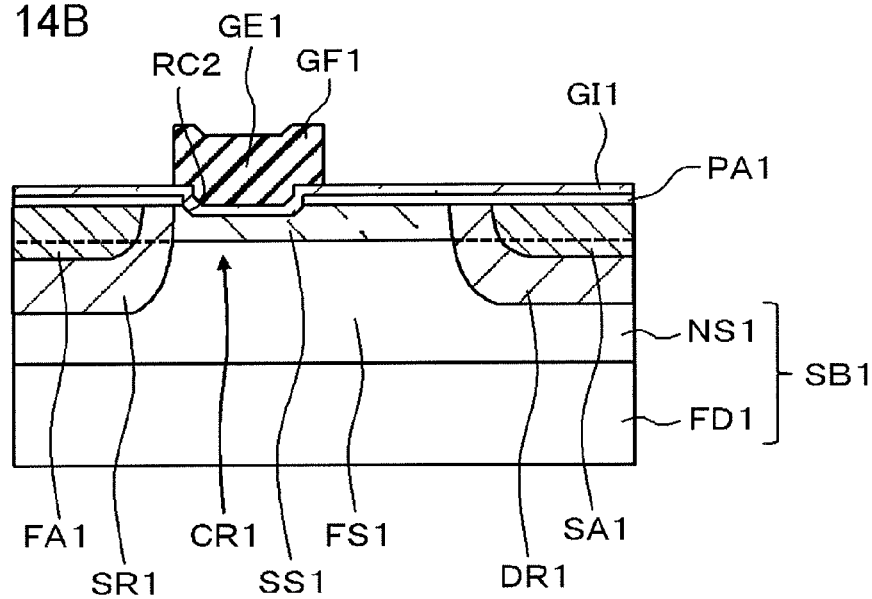

Subsequently, as represented in FIG. 14B, the gate electrode GE1 is formed on the gate insulating layer GI1. The gate electrode GE1 is provided in such a manner that a drain side end thereof is located at the outside of the channel region CR1 in a plan view. According to this configuration, a channel parasitic resistance may be decreased.

The subsequent processes may be performed in the same manner as the method of manufacturing the semiconductor device SM4 related to the fourth embodiment. As a result, the semiconductor device SM5 may be obtained.

Figure 15:
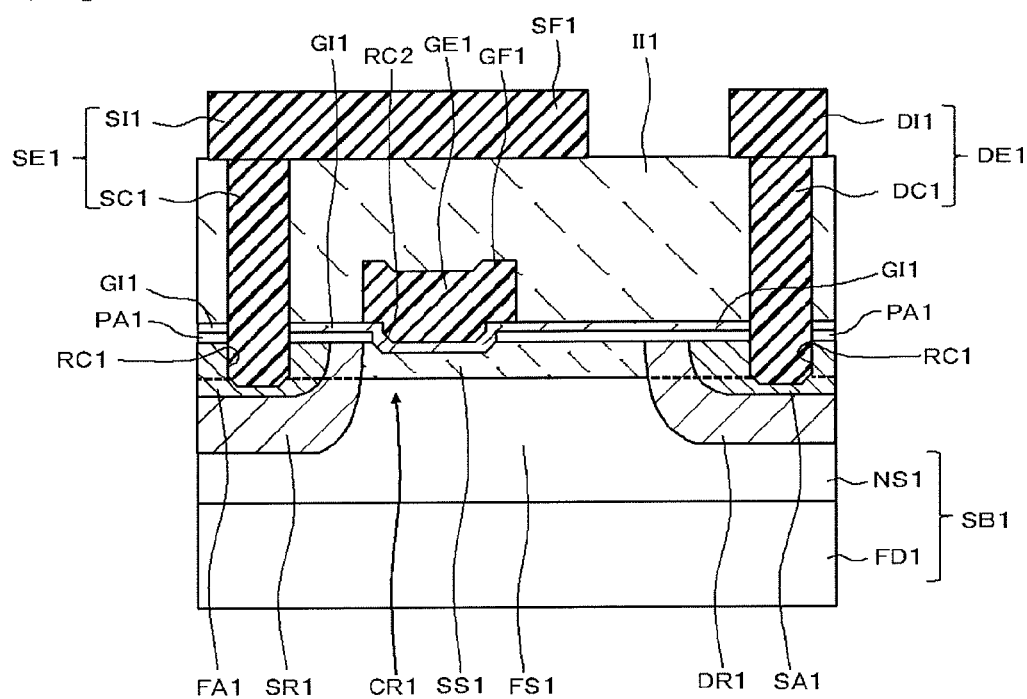
FIG. 15 represents a cross-sectional diagram illustrating a configuration of a modification example of the semiconductor device represented in FIG. 12.

FIG. 15 represents a cross-sectional diagram illustrating a configuration of a modification example of the semiconductor device SM5 represented in FIG. 12. As represented in FIG. 15, the semiconductor device SM5 may be further provided with a source field plate electrode SF1. For example, the source field plate electrode SF1 may have the same configuration as the source field plate electrode SF1 in the fourth embodiment represented in FIG. 11.

In this modification example, the source field plate electrode length is a length from a portion overlapping a drain side end of the gate field plate electrode GF1 to one end that is located between the gate electrode GE1 and the drain electrode DE1.

In the semiconductor device SM5 in which the drain withstanding voltage is approximately 600 V, and a drift length is approximately 7 µm, the source field plate electrode length is, for example, equal to or more than 1 µm and equal to or less than 4 µm. In addition, the source field plate insulating film thickness is, for example, equal to or more than 0.5 µm and equal to or less than 1 µm. The gate field plate electrode length is, for example, equal to or more than 0.1 µm and equal to or less than 1 µm. In addition, in this case, the gate field plate insulating film thickness is, for example, equal to or more than 0.05 µm and equal to or less than 0.4 µm.

According to this embodiment, the same effect as the fourth embodiment may be obtained.

In addition, the recess RC2 is provided in the semiconductor device SM5 related to this embodiment. Therefore, the second semiconductor layer SS1, which is located in the channel region CR1, becomes thin. Therefore, the threshold voltage of a semiconductor element may be raised.

Sixth Embodiment

Figure 16:
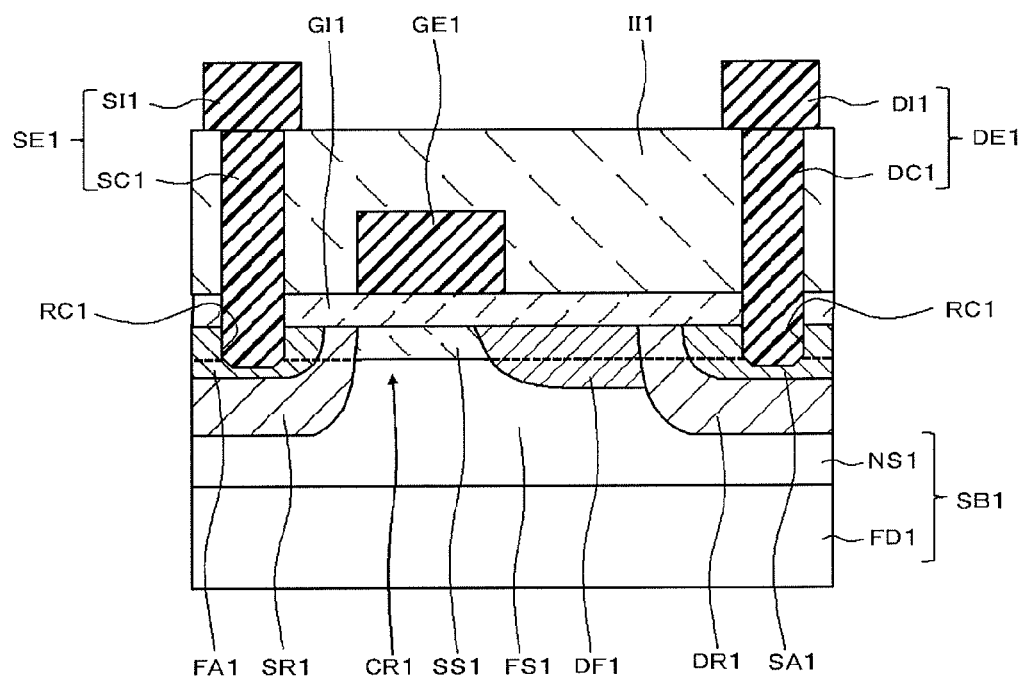
FIG. 16 represents a cross-sectional diagram illustrating a configuration of a semiconductor device related to a sixth embodiment.

FIG. 16 represents a cross-sectional diagram illustrating a configuration of a semiconductor device SM6 related to a sixth embodiment. The semiconductor device SM6 related to this embodiment has the same configuration as the fourth embodiment except that a drift region DF1 is provided.

For example, the drift region DF1 represented in FIG. 16 has the same configuration as the drift region DF1 making up the semiconductor device SM3 related to the third embodiment.

Figure 17:
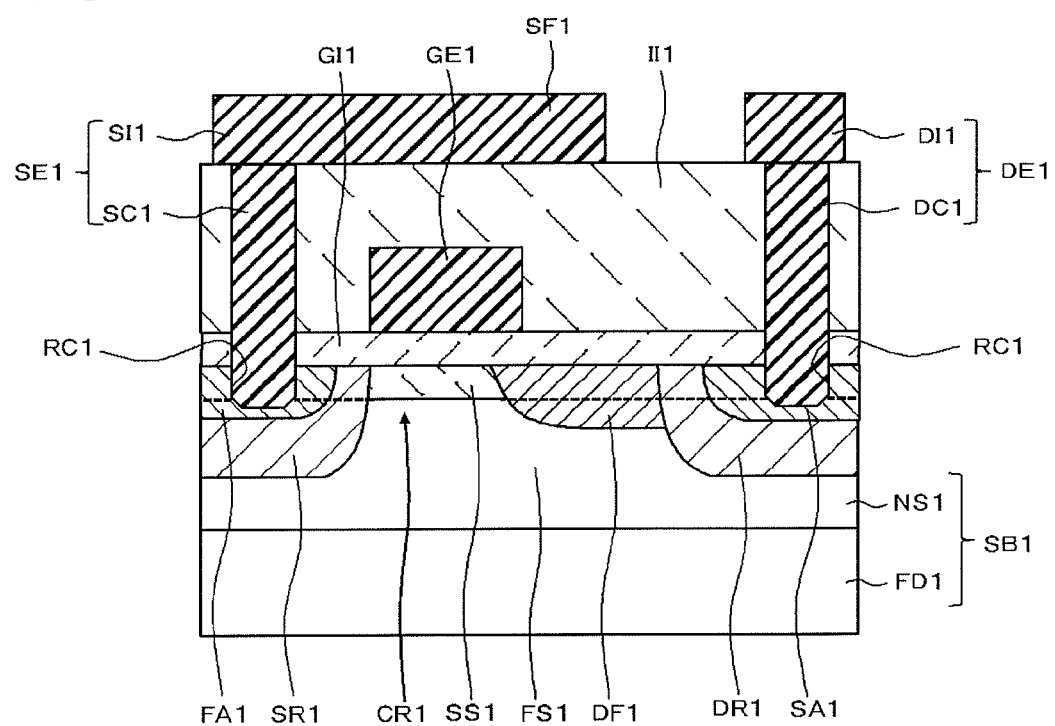
FIG. 17 represents a cross-sectional diagram illustrating a configuration of a modification example of the semiconductor device represented in FIG. 16.

FIG. 17 represents a cross-sectional diagram illustrating a modification example of the semiconductor device SM6 represented in FIG. 16. As represented in FIG. 17, the semiconductor device SM6 may be further provided with a source field plate electrode SF1. For example, the source field plate electrode SF1 may have the same configuration as the source field plate electrode SF1 in the fourth embodiment represented in FIG. 11.

According to this embodiment, the same effect as the fourth embodiment may be obtained.

In addition, since the drift region DF1 is provided, the threshold voltage may be raised and a low-loss semiconductor device may be provided.

Seventh Embodiment

Figure 18:
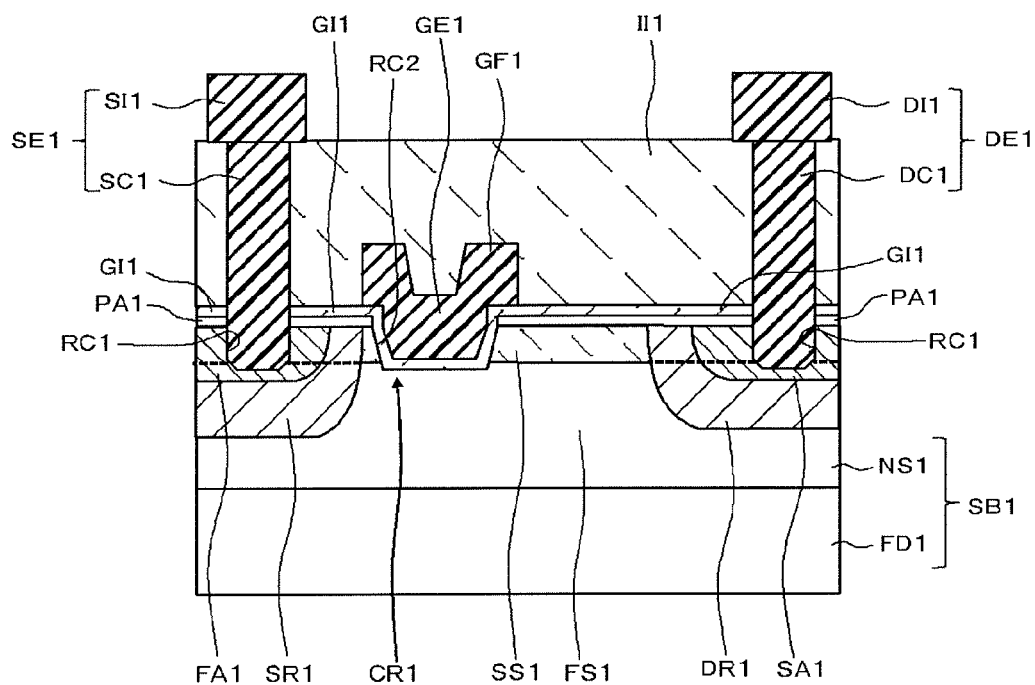
FIG. 18 represents a cross-sectional diagram illustrating a configuration of a semiconductor device related to a seventh embodiment.

FIG. 18 represents a cross-sectional diagram illustrating a configuration of a semiconductor device SM7 related to a seventh embodiment. The semiconductor device SM7 related to this embodiment has the same configuration as the semiconductor device SM5 related to the fifth embodiment except for the configuration of the recess RC2.

Hereinafter, description will be made in detail.

In this embodiment, the recess RC2 that is located below the gate electrode GE1 is formed to penetrate through the second semiconductor layer SS1 and to reach the first semiconductor layer FS1. In addition, for example, the recess RC2 is formed in a groove shape that extends in the same direction as the extending direction of the gate electrode GE1. Since the recess RC2 is provided to penetrate the second semiconductor layer SS1, a normally-off type semiconductor element is realized.

In addition, a Group II element that becomes a p-type impurity may be added to the first semiconductor layer FS1. According to this addition, the threshold voltage of a semiconductor element may be further raised. For example, Mg may be used as the Group II element. In addition, a p-type impurity concentration in the first semiconductor layer FS1 is, for example, equal to or more than $1 \times 10^{15}$ cm$^{-3}$ and equal to or less than $1 \times 10^{19}$ cm$^{-3}$, and preferably equal to or more than $1 \times 10^{17}$ cm$^{-3}$ and equal to or less than $5 \times 10^{18}$ cm$^{-3}$.

In this embodiment, for example, the depth of the recess RC1 and the depth of the recess RC2 are the same as each other. In this case, the recess RC1 and the recess RC2 may be formed at the same time. Therefore, complication of a manufacturing process during forming of the recess RC2 may be avoided.

In addition, in this embodiment, the gate electrode GE1 is formed on the nitride semiconductor layer NS1 in such a manner that at least a part of the gate electrode GE1 is located in the recess RC2.

Figure 19A:
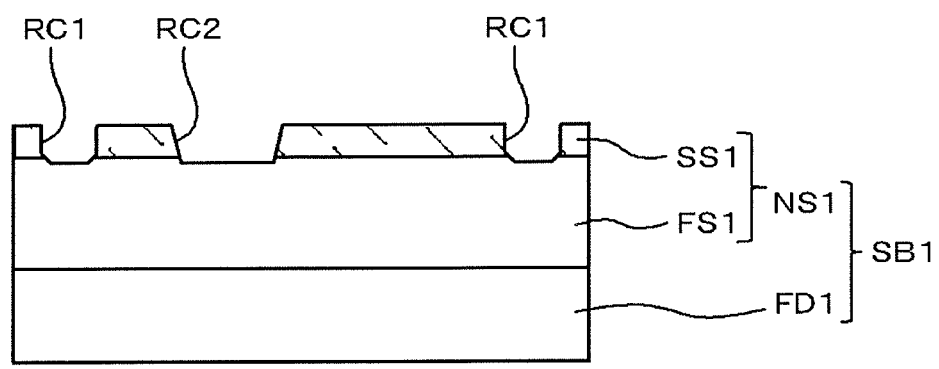
FIGS. 19A and 19B represent cross-sectional diagrams illustrating a method of manufacturing the semiconductor device related to the seventh embodiment.
Figure 19B:
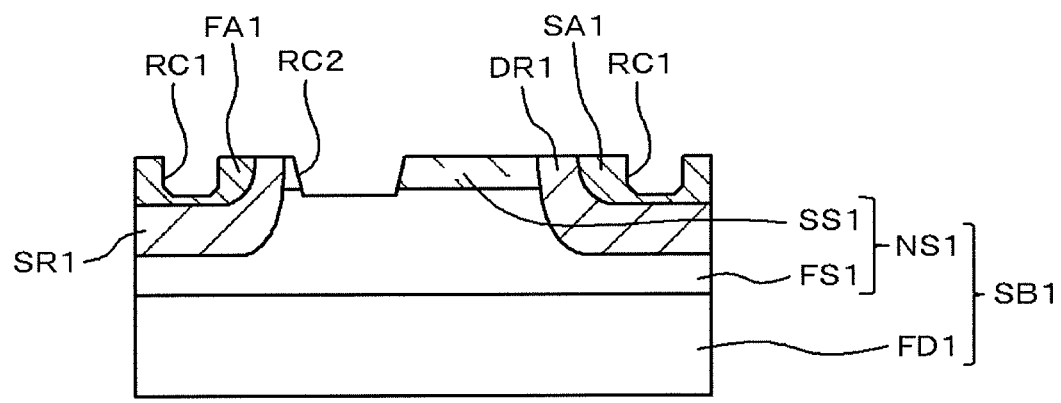

Next, a method of manufacturing the semiconductor device SM7 related to this embodiment will be described. FIGS. 19A and 19B represent cross-sectional diagrams illustrating the method of manufacturing the semiconductor device SM7 related to this embodiment.

First, similarly to the fifth embodiment, the semiconductor substrate SB1 is prepared. Subsequently, as represented in FIG. 19A, the recess RC1 is formed on a surface of the nitride semiconductor layer NS1. At this time, the recess RC2 is formed at the same time as the recess RC1 at a position that is present on the surface of the nitride semiconductor layer NS1 and is spaced from the recess RC1. Therefore, the depth of the recess RC1 and the depth of the recess RC2 become the same as each other.

For example, the recess RC1 and the recess RC2 are formed to penetrate through the second semiconductor layer SS1 and to reach the first semiconductor layer FS1.

Subsequently, as represented in FIG. 19B, the source region SR1 including the first amorphous region FA1 is formed, and the drain region DR1 including the second amorphous region SA1 is formed. At this time, the source region SR1 and the drain region DR1 are formed in such a manner that the recess RC1 fits within the first amorphous region FA1 or the second amorphous region SA1.

Subsequently, the passivation film PA1 is formed. The passivation film PA1 is formed on the second semiconductor layer SS1, in the recess RC1, and in the recess RC2. Subsequently, in the passivation film PA1, a portion thereof that is located in the recess RC1 and the recess RC2 is selectively removed. Subsequently, the gate insulating layer GI1 and the gate electrode GE1 are formed in this order. The gate electrode GE1 is formed on the nitride semiconductor layer NS1 in such a manner that at least a part of the gate electrode GE1 is located in the recess RC2.

The subsequent processes may be performed in the same manner as the method of manufacturing the semiconductor device SM5 related to the fifth embodiment. As a result, the semiconductor device SM7 may be obtained.

Figure 20:
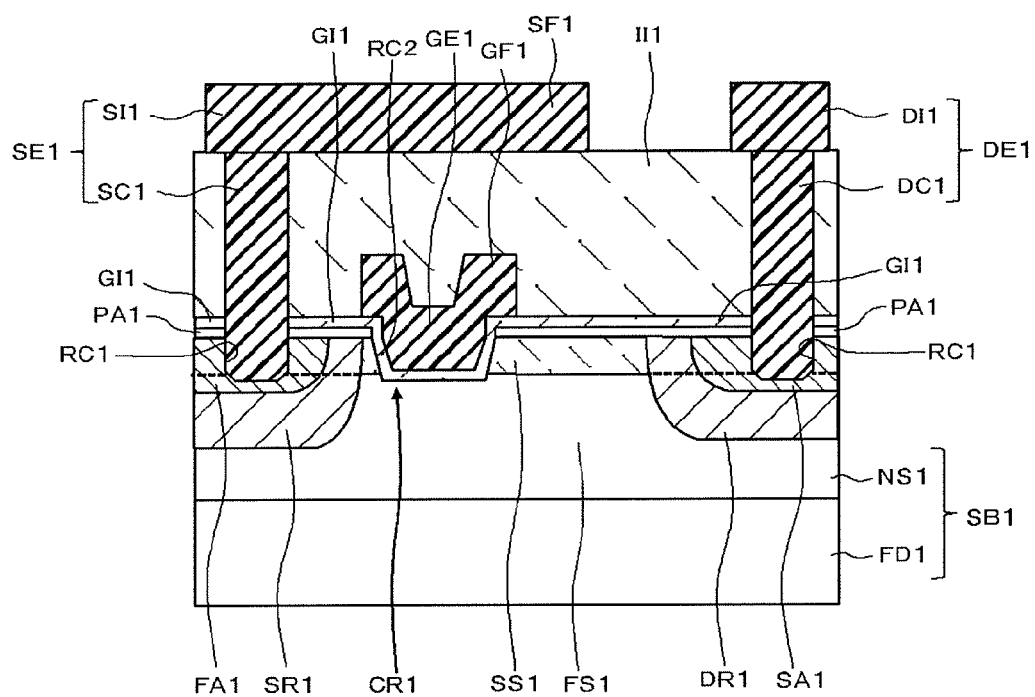
FIG. 20 represents a cross-sectional diagram illustrating a configuration of a modification example of the semiconductor device represented in FIG. 18.

FIG. 20 represents a cross-sectional diagram illustrating a modification example of the semiconductor device SM7 represented in FIG. 18. As represented in FIG. 20, the semiconductor device SM7 may be further provided with a source field plate electrode SF1. For example, the source field plate electrode SF1 may have the same configuration as the source field plate electrode SF1 in the fourth embodiment represented in FIG. 11.

According to this embodiment, the same effect as the fourth embodiment may be obtained.

According to this embodiment, the recess RC2 is formed below the gate electrode GE1 to penetrate through the second semiconductor layer SS1 and to reach the first semiconductor layer FS1. Therefore, a normally-off type semiconductor element may be realized.

Hereinbefore, description was made with respect to a transistor from the first to seventh embodiments, but the embodiments are applicable to a pn conjunction diode. For example, an amorphous region may be formed at the interface between a p-type impurity region and a metallic layer and at the interface between an n-type impurity region and a metallic layer, respectively. According to this configuration, a parasitic resistance is decreased, and thus a low-loss pn conjunction diode may be obtained.

Hereinbefore, the invention made by the present inventors was described in detail on the basis of the embodiments, but the invention is not limited to the above-described embodiments, and various modifications may be made within a range not departing from the gist of the invention.

A part of contents described in the embodiments will be described below.

(1) A method of manufacturing a semiconductor device, including: implanting an impurity of a first conductivity type in a semiconductor substrate including a nitride semiconductor layer formed from a nitride semiconductor on at least one surface side to form an amorphous impurity region; annealing the semiconductor substrate; and forming a metallic layer to come into contact with the amorphous region in the impurity region.

(2) The method of manufacturing a semiconductor device according to (1), wherein in the step of forming the impurity region, a source region that is a first of the impurity region is formed in the nitride semiconductor layer, and a drain region that is a second of the impurity region is formed in the nitride semiconductor layer at a position spaced apart from the source region in a plan view, and wherein the method further includes forming a gate insulating layer at least on a channel region that is a region, which is interposed between the source region and the drain region in a plan view, of the nitride semiconductor layer, and forming a gate electrode to come into contact on the gate insulating layer.

(3) The method of manufacturing a semiconductor device according to (1) or (2), wherein the semiconductor substrate is provided with a Si substrate, and the nitride semiconductor layer is provided on the Si substrate.

(4) The method of manufacturing a semiconductor device according to any one of (1) to (3), wherein a diameter of the semiconductor substrate is equal to or more than 6 inches.

(5) The method of manufacturing a semiconductor device according to any one of (1) to (4), wherein the nitride semiconductor includes a first semiconductor layer that is formed from GaN, and a second semiconductor layer that is provided on the first semiconductor layer and is formed from AlGaN, and wherein the method further includes forming a first recess on a surface of the nitride semiconductor layer before forming the metallic layer, and in the step of forming the metallic layer, the metallic layer is formed in such a manner that a part of the metallic layer is located in the first recess.

(6) The method of manufacturing a semiconductor device according to (5), wherein in the step of forming the first recess is performed before the step of forming the impurity region.

(7) The method of manufacturing a semiconductor device according to (5), wherein in the step of forming the first recess, a second recess is formed on a surface of the nitride semiconductor layer at a position spaced apart from the first recess simultaneously with the first recess, and wherein the method further include forming a gate electrode on the nitride semiconductor layer in such a manner that at least a part of the gate electrode is located in the second recess.

(8) The method of manufacturing a semiconductor device according to (5), further including: forming an insulating interlayer on the semiconductor substrate; and forming an opening in the insulating interlayer to bury the metallic layer, after the step of annealing the semiconductor substrate and before the step of forming the metallic layer, wherein the first recess is formed together with the opening in step of the forming the opening.

It is apparent that the present invention is not limited to the above embodiment, and may be modified and changed without departing from the scope and spirit of the invention.

What is claimed is:

1. A semiconductor device, comprising:
a semiconductor substrate that includes a nitride semiconductor layer formed from a nitride semiconductor on at least one surface side;
an impurity region that is provided on the one surface side in the nitride semiconductor layer and contains a first conductivity type impurity;
an amorphous region that is a part of the impurity region and is located in a surface layer of the impurity region; and
a metallic layer that comes into contact with the amorphous region.

2. The semiconductor device according to claim 1, wherein the amorphous region includes a crystal defect that is formed by ion implantation of the impurity.

3. The semiconductor device according to claim 1, wherein the amorphous region and the metallic layer come into ohmic contact with each other.

4. The semiconductor device according to claim 1, wherein the amorphous region includes a microcrystalline region in which a grain size is equal to or less than 10 nm.

5. The semiconductor device according to claim 1, further comprising:
a source region that is provided in the nitride semiconductor layer and is a first of the impurity region;
a drain region that is provided in the nitride semiconductor layer to be spaced apart from the source region in a plan view and that is a second of the impurity region;
a channel region that is a region interposed between the source region and the drain region of the nitride semiconductor layer in a plan view;
a gate insulating layer that is provided on at least the channel region; and
a gate electrode that comes into contact on the gate insulating layer,
wherein a first of the amorphous region and a second of the amorphous region are formed on surface layers of the source region and the drain region, respectively.

6. The semiconductor device according to claim 5, further comprising:
a drift region that is provided in the nitride semiconductor layer to be spaced apart from the source region with the channel region interposed between the drift region and the source region in a plan view, that comes into contact with the drain region on the source region side thereof, and that is a third of the impurity region having a concentration lower than a concentration of the source region and the drain region.

7. The semiconductor device according to claim 5,
wherein the nitride semiconductor layer includes,
a first semiconductor layer, and
a second semiconductor layer that is provided on the first semiconductor layer to be located on the one surface side, and that has a bandgap larger than a bandgap of the first semiconductor layer.

8. The semiconductor device according to claim 7,
wherein the first semiconductor layer is formed from GaN, and
the second semiconductor layer is formed from AlGaN.

9. The semiconductor device according to claim 8,
wherein a first recess is formed on a surface of the amorphous region, and
a part of the metallic layer is located in the first recess.

10. The semiconductor device according to claim 9,
wherein the amorphous region is formed across the second semiconductor layer and the first semiconductor layer, and
the first recess penetrates through the second semiconductor layer and reaches the first semiconductor layer.

11. The semiconductor device according to claim 9,
wherein a second recess, which penetrates through the second semiconductor layer and reaches the first semiconductor layer, is formed on a surface of the nitride semiconductor layer at a portion that is located below the gate electrode, and
a depth of the first recess and a depth of the second recess are the same as each other.

12. The semiconductor device according to claim 5,
wherein a length of the gate electrode in a direction from the source region to the drain region is equal to or more than 5 nm and is equal to or less than 500 nm.

13. The semiconductor device according to claim 1,
wherein the nitride semiconductor layer contains an impurity of a second conductivity type that is opposite to the first conductivity type in such a manner that an impurity concentration increases in a depth direction.

14. The semiconductor device according to claim 13,
wherein the impurity concentration of the second conductivity type of the nitride semiconductor layer at least on the one surface side is equal to or less than $5 \times 10^{-18}$ atoms/cm$^3$.

15. The semiconductor device according to claim 1,
wherein the metallic layer is a single layer film or a laminated film that includes one or more materials selected from a group consisting of Ti, Al, Mo, W, Ru, Au, and V, or a nitride including the materials.

16. The semiconductor device according to claim 1,
wherein a depth of the amorphous region is equal to or more than 15 nm and equal to or less than 300 nm.

17. The semiconductor device according to claim 1,
wherein the semiconductor substrate includes a Si substrate, and
the nitride semiconductor layer is provided on the Si substrate.

18. A method of manufacturing a semiconductor device, comprising:
implanting an impurity of a first conductivity type in a semiconductor substrate including a nitride semiconductor layer formed from a nitride semiconductor on at least one surface side to form an amorphous impurity region;
annealing the semiconductor substrate in a condition in which an amorphous region remains in a part of the impurity region; and
forming a metallic layer to come into contact with the amorphous region of the impurity region.

19. The method of manufacturing a semiconductor device according to claim 18,
wherein in the step of annealing the semiconductor substrate, the annealing is performed at a temperature equal to or higher than 1,000° C. and lower than 1,300° C.

20. The method of manufacturing a semiconductor device according to claim 18,
wherein in the step of forming the impurity region, the impurity is implanted at an acceleration voltage equal to or more than 1 keV and less than 100 keV.

* * * * *